(12) United States Patent
Yamazaki

(10) Patent No.: US 6,482,684 B1
(45) Date of Patent: Nov. 19, 2002

(54) METHOD OF MANUFACTURING A TFT WITH GE SEEDED AMORPHOUS SI LAYER

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/275,423

(22) Filed: Mar. 24, 1999

(30) Foreign Application Priority Data

Mar. 27, 1998 (JP) .......................................... 10-100642
Mar. 27, 1998 (JP) .......................................... 10-100644

(51) Int. Cl.$^7$ ............................................. H01L 21/00
(52) U.S. Cl. ...................... 438/158; 438/149; 438/151; 257/66
(58) Field of Search ........................... 257/66; 438/149, 438/151, 158

(56) References Cited

U.S. PATENT DOCUMENTS

| | | | |
|---|---|---|---|
| 4,971,832 A | * 11/1990 | Arai et al. .................... 427/575 |
| 5,424,244 A | 6/1995 | Zhang et al. ................. 438/301 |
| 5,643,826 A | 7/1997 | Ohtani et al. ................ 438/162 |
| 5,700,333 A | 12/1997 | Yamazaki et al. ........... 136/258 |
| 5,808,321 A | 9/1998 | Mitanaga et al. ............ 257/72 |
| 5,830,784 A | 11/1998 | Zhang et al. ................. 438/154 |
| 5,859,443 A | 1/1999 | Yamazaki et al. ............ 257/65 |
| 5,897,347 A | 4/1999 | Yamazaki et al. ........... 439/166 |
| 5,915,174 A | 6/1999 | Yamazaki et al. ........... 438/166 |
| 5,923,997 A | 7/1999 | Mitanage et al. ............ 438/486 |
| 5,932,893 A | 8/1999 | Miyanaga et al. ............ 257/66 |
| 5,937,282 A | * 8/1999 | Nakajima et al. ............ 438/149 |
| 5,953,597 A | 9/1999 | Kusumoto et al. ........... 438/161 |
| 5,961,743 A | 10/1999 | Yamazaki et al. ........... 136/258 |
| 5,962,871 A | 10/1999 | Zhang et al. ................. 257/66 |
| 5,977,559 A | 11/1999 | Zhang et al. ................. 257/57 |
| 5,985,740 A | * 11/1999 | Yamazaki et al. ........... 438/486 |
| 6,037,635 A | * 3/2000 | Yamazaki .................... 257/353 |

FOREIGN PATENT DOCUMENTS

| JP | 7-130652 | 5/1995 |
|---|---|---|
| JP | 9-312260 | 12/1997 |

OTHER PUBLICATIONS

Subramanian et al., A Novel Technique for 3–D Integration: Ge–seeded Laterally Crystallized TFTs, Digest of Technical Papers: 1997 Symposium on VLSI Technology, (Jun. 10–12, 1997), pp. 97–98.*

James W. Mayer, "Electronic Material Science: For Intergrated Circuits in Si and GaAs," Macmillan Publishing Company, New York, 1990, pp. 176–179.

* cited by examiner

*Primary Examiner*—Richard Elms
*Assistant Examiner*—Christian D. Wilson
(74) *Attorney, Agent, or Firm*—Eric J. Robinson; Robinson Intellectual Property Law Office, PC

(57) ABSTRACT

There is provided a semiconductor device using a semiconductor thin film having high crystallinity, which is formed by a manufacturing method with high productivity. When active layers of an amorphous silicon film are crystallized, germanium is used as a catalytic element for facilitating crystallization. When a heat treatment is carried out in a state where the active layers are in contact with a germanium film through an opening portion provided in a mask insulating film, the active layers made of a polysilicon film are obtained by crystal growth in a lateral direction.

67 Claims, 10 Drawing Sheets

DRIVER CIRCUIT        PIXEL MATRIX CIRCUIT

DRIVER CIRCUIT          PIXEL MATRIX CIRCUIT

METHOD OF MANUFACTURING A TFT WITH GE SEEDED AMORPHOUS SI LAYER

BACKGROUND OF THE INVENTION

1. Field of the Invention

The present invention relates to a semiconductor device including a circuit constituted of bottom gate type thin film transistors (hereinafter abbreviated as TFT) formed by using a semiconductor thin film. Particularly, the present invention relates to a semiconductor device using inverted stagger type TFTs.

Incidentally, in the present specification, the semiconductor device means a device capable of functioning with semiconductor characteristics, and includes not only a single component such as a TFT but also a semiconductor circuit, an electro-optical device, and an electronic equipment incorporating the circuit or device as a part.

2. Description of the Related Art

In recent years, a semiconductor device has attracted attention, in which TFTs are formed on a substrate by using a semiconductor thin film having crystallinity and a circuit is constituted of the TFTs. Although polycrystal silicon (also called polysilicon) is most popular for a semiconductor thin film, researches for using a compound semiconductor expressed by $Si_xGe_{1-x}$ ($0<X<1$) has also been carried out.

Although a TFT using a polysilicon film has reached the stage of practical use, there is much room for development in improvement of film quality and mass productivity, and further technical development is needed. In such circumstances, Japanese Patent Laid-Open No. Hei. 7-130652, the disclosure of which is herein is incorporated by reference, by the present applicant discloses a technique as means for solving the problems of the improvement of film quality of polysilicon and the improvement of mass productivity at the same time.

The technique disclosed in the publication is such that a catalytic element for facilitating crystallization of silicon is added to an amorphous semiconductor film (typically amorphous silicon) so that crystallization is made by using the function thereof. As a result, temperature and time necessary for crystallization was lowered and throughput was remarkably improved. Further, it was ascertained that obtained polysilicon had extremely high crystallinity and electrical characteristics of a TFT was greatly improved.

However, since nickel (Ni) that is most effective as the catalytic element is a metal element, there is a fear that if nickel remains in polysilicon, it has a bad influence on TFT characteristics. Thus, the present applicant has considered that it is necessary to remove surplus nickel after completion of crystallization, and has developed a technique for carrying out gettering of the catalytic element (Japanese Patent Laid-open No . Hei. 9-312260, the disclosure of which is herein incorporated by reference).

In both of the techniques set forth in these publications, the point is to use a metal element , such as nickel, as a catalytic element for facilitating crystallization. The catalytic element itself becomes unnecessary after polysilicon is obtained.

SUMMARY OF THE INVENTION

The present invention has been made in view of the above problems, and an object thereof is to provide a technique for forming a semiconductor thin film with high crystallinity by a manufacturing method having high productivity. Another object is to make improvement in a manufacturing yield and manufacturing cost of a semiconductor device by constructing a circuit with TFTs using such a semiconductor thin film.

According to the present invention, germanium (Ge) of semiconductor is used as a catalytic element for facilitating crystallization of silicon, so that a process which does not require gettering is provided. Since germanium has properties which are very close to those of silicon, it exists in silicon in the good state of conformity. That is, germanium has a merit that even if it is not particularly removed after the use as a catalytic element, it does not have a bad influence on TFT characteristics.

Basically, germanium is added to an amorphous silicon film, and the amorphous silicon film is crystallized by using the catalytic function of germanium. By this, lowering of temperature at crystallization, lowering of a process time, and shortening of steps can be realized at the same time.

Since germanium exists in silicon in the state with extremely excellent conformity, as compared with cases of using other catalytic elements, crystallinity is very high. Since germanium continuously changes the bandgap of silicon according to its content, it is possible to form an active layer with a bandgap narrower than polysilicon. By using such an active layer for a TFT, a mobility (field effect mobility) higher than that of a TFT using an active layer of polysilicon can be realized.

DETAILED DESCRIPTION OF THE PREFERRED EMBODIMENTS

Preferred embodiment of the present invention having the above structures will next be described in detail.

[Embodiment 1]

Manufacturing steps of a TFT using the present invention will be described with reference to FIGS. 1A to 1D, and FIGS. 2A to 2D. Here, exemplification will be made on a case of manufacturing, as a basic structure of a circuit, a CMOS circuit in which an NTFT (N-channel TFT) and a PTFT (P-channel TFT) are complementarily combined on the same substrate. First, an under film 102 made of a silicon oxide film is provided on a glass substrate 101, and gate electrodes 103 and 104 are formed thereon. Although not shown, gate wiring lines connected to the gate electrodes are formed at the same time.

In this embodiment, as conductive films of the gate electrodes 103 and 104, a three-layer structure of tantalum nitride/tantalum/tantalum nitride is adopted. Its film thickness is controlled within the range of 200 to 400 nm. Then a gate insulating film 105 made of a silicon nitride oxide film expressed by $SiO_xN_y$ and having a thickness of 150 nm is formed thereon.

Figure 1A:
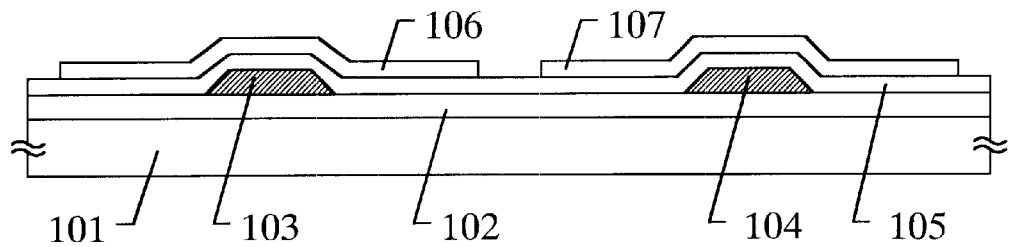
FIGS. 1A to 1D are views showing manufacturing steps of a thin film transistor of Embodiment 1.

Next, an amorphous silicon film as an amorphous semiconductor film with a thickness of 30 nm is formed, and is patterned to form active layers 106 and 107. Other than the amorphous silicon film, a compound semiconductor such as silicon germanium compound expressed by $Si_xGe_{1-x}$ (0<X<1) may also be used (FIG. 1A).

Next, a mask insulating film 108 made of a silicon oxide film is formed on the active layers 106 and 107, and opening portions 109 are formed by patterning. This opening portions 109 are formed so that the active layers which become a source region or drain region later are exposed.

After the opening portions 109 are formed, a germanium film 110 is formed by a sputtering method, and the active layers 106 and 107 are brought into contact with the germanium film 110. A germanium target is used for the film formation, reached pressure is set to $4 \times 10^{-4}$ Pa or less, sputtering gas is argon (Ar), film formation temperature is set to room temperature, film formation pressure is set to 0.4 Pa, and DC current at film formation is set to 0.4 A.

Film formation of the germanium film 110 can also be carried out by a low pressure CVD method or plasma CVD method. Since germane ($GeH_4$) is a gas that is decomposed very easily, it is easily decomposed at a low temperature of about 450° C. and a germanium film can be formed.

Figure 1B:
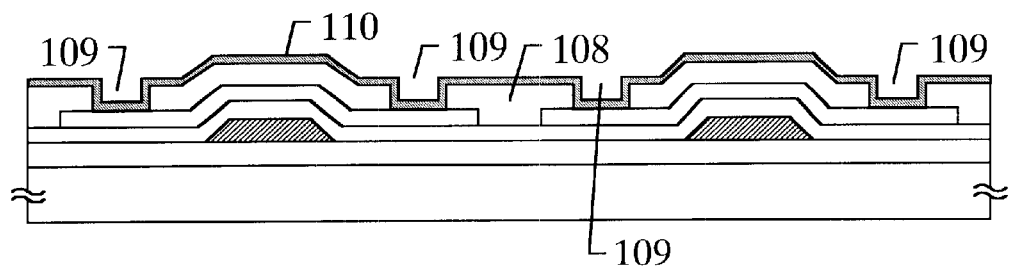
Figure 1C:
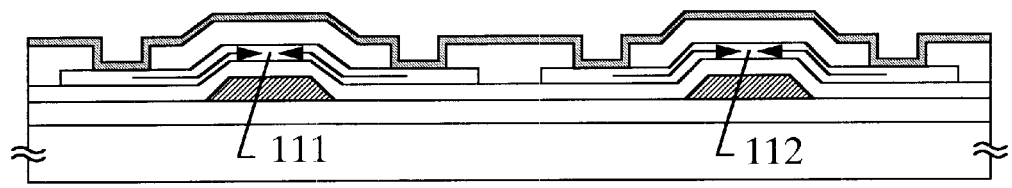

In this way, the state of FIG. 1B is obtained. Next, a heat treatment at 600° C. for 12 hours is carried out, so that the amorphous silicon film is crystallized and is transformed into a polysilicon film as a crystal semiconductor film. At this time, crystallization starts at a region (opening portion) where the amorphous silicon film is in contact with the germanium film, and crystal growth in a lateral direction progresses in the direction indicated by arrows (FIG. 1C).

Incidentally, when the temperature exceeds 600° C., natural nucleus generation in the amorphous silicon film increases and prevents crystal growth from progressing in the lateral direction, which is not preferable. This crystallization step may be carried out by any means of furnace annealing, lamp annealing, and laser annealing. In this embodiment, importance is attached to uniformity of a formed film and the furnace annealing is used.

It is desirable that the atmosphere of the heat treatment is made an inert gas atmosphere or hydrogen atmosphere. If oxygen exists, the germanium film is easily oxidized, and is transformed into an inactive germanium oxide film. Since this may damage the catalytic function and poor crystallization occurs, attention must be paid.

As in this embodiment, in the case where crystal growth is made in the lateral direction by using germanium as a catalytic element, attention must be paid to the fact that the growth distance is very short. In the case of FIG. 1C, crystal growth starts just from the portions which become the source region and drain region, and the growth meets with each other at substantially the center of a portion which becomes a channel formation region.

Thus, in order to crystallize at least the whole region of the channel formation region, the growth must progress for the distance of at least the half of the width (channel length) of the channel formation region in the direction connecting the source and drain. Since the crystal growth meets with each other at substantially the center of the channel formation region, grain boundaries (not shown) are formed at that portion.

In the case where crystal growth is made in the manner of this embodiment, although the growth distance in the lateral direction is changed by the temperature of a heat treatment and treatment time thereof, it appears that the growth for about 1 μm is the limit in view of throughput and device performance. In that sense, it can be said to be preferable that the size of a device to which the present invention is applied is such that the channel length is 2 μm or less, preferably 1 μm or less (of course, zero is not included).

In this way, active layers 111 and 112 made of polysilicon films are obtained. The concentration of germanium in the active layers 111 and 112 gradually becomes higher toward the main surface of the portion where the active layers are in contact with the germanium film 110 through the opening portion 109.

Typically, in many cases, germanium is contained in only the vicinity of the main surface (region within about 10 nm from the surface of the polysilicon film at the side opposite to the under layer). According to the SIMS (Secondary Ion Mass Spectroscopy), it was ascertained that the concentration of germanium in the vicinity of the main surface was $1 \times 10^{14}$ to $1 \times 10^{22}$ atoms/cm³. However, since this portion finally becomes the source region or drain region, there is no problem.

Incidentally, it is conceivable that when the concentration of germanium is $1 \times 10^{20}$ to $1 \times 10^{22}$ atoms/cm³, an alloy of silicon and germanium is formed, and a silicon germanium layer expressed by $Si_xGe_{1-x}$ (0<X<1) is formed. Thus, in the step of this embodiment, there can be a case where a silicon germanium layer is formed in the vicinity of the main surface of the portion which becomes the source region or drain region later.

After the active layers 111 and 112 are obtained in this way, the germanium film 110 is removed by a sulfuric-acid peroxide solution ($H_2SO_4:H_2O_2=1:1$), and then, the mask insulating film 108 is removed. Thereafter, the active layers 111 and 112 may be irradiated with excimer laser light to further improve crystallinity.

Next, a silicon oxide film with a thickness of 120 nm is formed, and is patterned to form spacer insulating layers 113 and 114. After the spacer insulating layers 113 and 114 are formed, an impurity element (phosphorus in this embodiment) for giving an n-type is added to form an n-type impurity region 115 (FIG. 1D).

In this embodiment, a plasma doping method is used, and phosphine ($PH_3$) is used as a doping gas. It is appropriate that the acceleration voltage is set to 10 kV, and the addition is made with a dosage of $5 \times 10^{14}$ atoms/cm². Incidentally, it is not necessary to limit the doping conditions to this embodiment, but they may be changed according to the necessity.

Figure 1D:
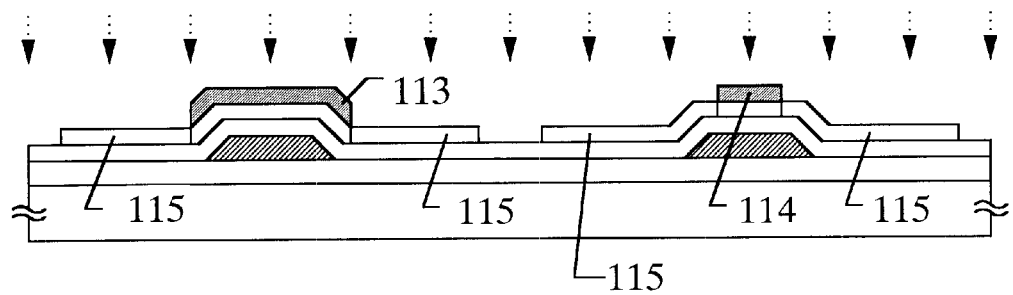
Figure 2A:
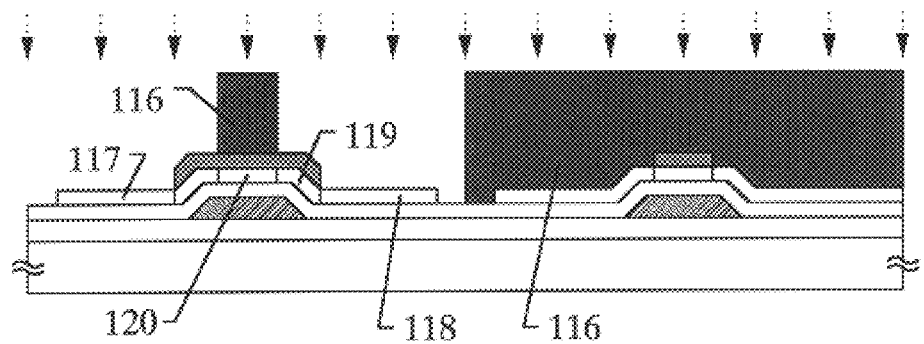
FIGS. 2A to 2D are views showing manufacturing steps of a thin film transistor of Embodiments 1 and 2.

After the state of FIG. 1D is obtained in this way, a resist mask 116 is selectively provided, and a second n-type impurity adding step is carried out. The resist mask 116 is formed, in a region which becomes an NTFT, above a region where a channel formation region is formed later, and is formed in a region which becomes a PTFT so that the n-type impurity is not added to the region (FIG. 2A).

Here, the acceleration voltage is set to 90 kV that is slightly higher than the former case, and the dosage is $3 \times 10^{13}$ atoms/cm². At this acceleration voltage, the spacer insulating layers 113 and 114 do not function as masks, so that impurity ions are added also in the silicon film under the end (region that is not covered with the resist mask 116) of the spacer insulating layer.

With this step, a source region 117, a drain region 118, a pair of LDD regions (low concentration impurity regions) 119, and a channel formation region 120 of the NTFT are defined. Since the second doping step is also a formation step of the LDD regions as it is, it is necessary for an operator to suitably determine an optimum doping amount for the LDD regions.

Figure 2B:
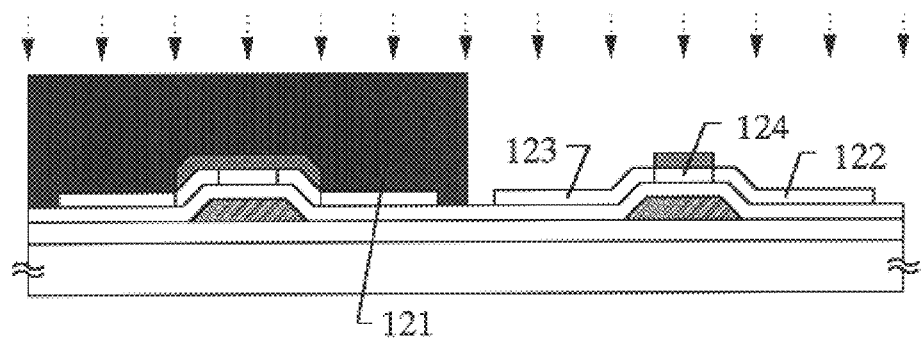

Next, after the resist mask 116 is removed, the region that becomes the NTFT is completely covered with a resist mask 121, and an impurity element (boron in this embodiment) for giving a p-type is added. Here, diborane ($B_2H_6$) is used as a doping gas, acceleration voltage is set to 10 kV, and dosage is $1.3 \times 10^{15}$ atoms/cm² (FIG. 2B).

In this step, since the spacer insulating layer 114 completely functions as a mask, any impurity is not added in the region thereunder, and the spacer insulating layer directly defines a source region 122, a drain region 123, and a channel formation region 124. Incidentally, in the step of FIG. 1D, although phosphorus is added also in the region which becomes the PTFT, the conductivity is inverted into a p-type by this step.

Figure 2C:
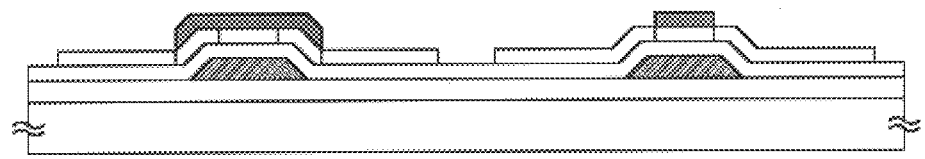

After the adding step of impurity ions for forming the source region, drain region and LDD region is completed in this way, the resist mask 121 is removed, and an activating step of impurities is carried out. In this embodiment, although activation is made by irradiation of excimer laser light, furnace annealing or lamp annealing may be used. Of course, they may be used at the same time (FIG. 2C).

Incidentally, the spacer insulating layers 113 and 114 may be removed before the activation step of impurities. The efficiency of activation by irradiation of laser light is greatly improved by the removal. However, if the spacer insulating layers are removed, channel formation regions are exposed, and hence it is preferable to remain the layers as possible.

Next, an interlayer insulating film 125 made of a silicon oxide film is formed, contact holes are formed, and source wiring lines 126 and 127, and a drain wiring line 128 made of conductive films are formed. At this time, it is necessary to form a contact hole (not shown) for electrical connection between the gate wiring line connected to the gate electrode and the source wiring line (or drain wiring line) at the same time.

Figure 2D:
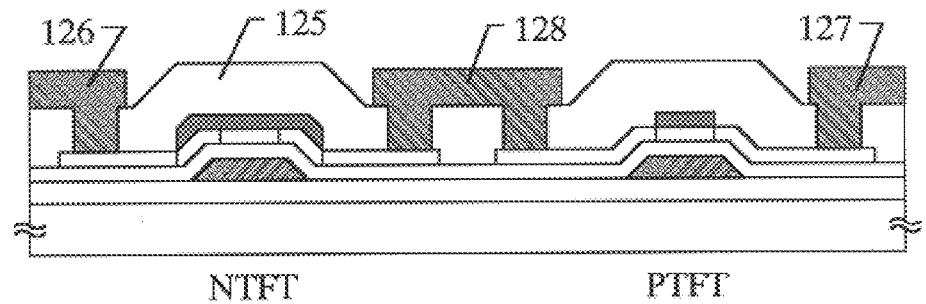

Finally, the entirety is subjected to a heat treatment at approximately 350° C. for about 2 hours in a hydrogen atmosphere, so that dangling bonds in the film (especially in the channel formation region) are terminated with hydrogen. Through the above steps, the CMOS circuit with the structure as shown in FIG. 2D is completed.

As a feature of a TFT manufactured through the steps of this embodiment, the concentration of germanium in the source region or drain region gradually becomes higher toward the main surface. This is because crystallization is carried out while being contacted with germanium at the main surface. Typically, in many cases, germanium exists in only the vicinity of the main surface. The concentration of germanium in that case is approximately $1 \times 10^{14}$ to $1 \times 10^{22}$ atoms/cm³.

On the other hand, it can be assumed that germanium hardly exists in the channel formation region. At crystallization, although crystal growth progresses from the portion that becomes the source region or drain region, diffusion of germanium does not occur. In subsequent steps as well, there is no such a heat treatment step that germanium is diffused. Thus, it is also a feature of the TFT manufactured in this embodiment that germanium with a concentration in the source region or drain region higher than that in the channel formation region exists.

In the present invention, a circuit is constituted of inverted stagger type TFTs manufactured through the steps as described above. Incidentally, the manufacturing steps of this embodiment are merely one example for carrying out the present invention, and the invention is not limited to this.

Although this embodiment does not adopt, an operator may suitably make such a contrivance that channel doping to the NTFT and PTFT is carried out to control a threshold voltage.

In the inverted stagger type TFT manufactured in accordance with the steps of this embodiment, the mobility (field effect mobility) as a typical electric characteristic is 100 to 200 cm²/Vs for an NTFT and 80 to 150 cm²/Vs for a PTFT, and the S value (subthreshold coefficient) is 0.2 to 0.4 V/decade for both the NTFT and PTFT. These values show that the TFT of the present invention is comparable with or exceeds a TFT manufactured by a conventional technique.

Moreover, in the present invention, since it is not necessary to remove the catalytic element (germanium) used for crystallization of the amorphous silicon film, the number of steps can be greatly reduced as compared with the prior art (technique using a metal element as a catalytic element).

The important point in the structure of the present invention is to crystallize an amorphous silicon film by using germanium as a catalyst, and this structure is not limited to the structure of a TFT. Thus, the present invention can also be applied to a top gate type TFT such as a planar type TFT or stagger type TFT.

[Embodiment 2]

Manufacturing steps of a TFT using this embodiment will be described with reference to FIGS. 4A to 4E and FIGS. 2A to 2D. Here, exemplification will be made on a case of manufacturing, as a basic structure of a circuit, a CMOS circuit in which an NTFT (N-channel TFT) and a PTFT (P-channel TFT) are complementarily combined on the same substrate.

First, an under film 1102 made of a silicon oxide film is provided on a quartz substrate 1101, and gate electrodes 1103 and 1104 are formed thereon. Although not shown, gate wiring lines connected to the gate electrodes are formed at the same time.

The reason why the quartz substrate is used in this embodiment is that in a subsequent thermal oxidation step, a high temperature process at a temperature exceeding 700° C. is carried out, so that the substrate having high heat resistance is required. Thus, instead of the quartz substrate, a silicon substrate, a ceramic substrate, or a crystallized glass substrate may be used. In the case of quartz, the under film may not be provided.

In this embodiment, for a conductive film that becomes the gate electrodes 1103 and 1104, a three-layer structure of tantalum nitride/tantalum/tantalum nitride is adopted. Its film thickness is controlled within the range of 200 to 400 nm. In the case of this embodiment, as described before, since a high temperature process is carried out in a subsequent step, it is necessary to use the conductive film having high heat resistance. As other materials, chromium, titanium, or tungsten may be used.

A gate insulating film 1105 made of a silicon nitride oxide film expressed by $SiO_xN_y$ with a thickness of 150 nm is formed thereon. Of course, silicon oxide, silicon nitride, or laminated structure thereof may be adopted.

Figure 4A:
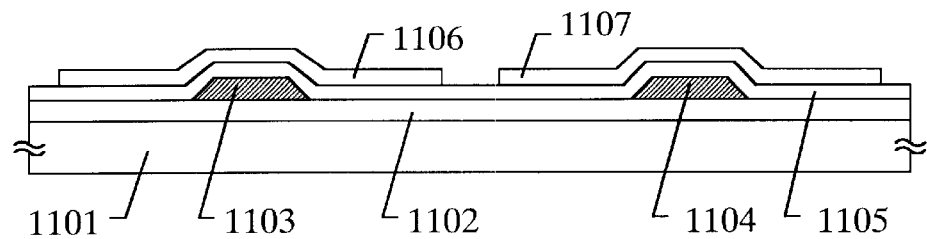
FIGS. 4A to 4E are views showing manufacturing steps of a thin film transistor of Embodiment 2.

Next, an amorphous silicon film of an amorphous semiconductor film with a thickness of 30 nm is formed, and is patterned to form active layers 1106 and 1107. Other than the amorphous silicon film, a compound semiconductor such as a silicon germanium compound expressed by $Si_xGe_{1-x}$ (0<X<1) may also be used (FIG. 4A).

Next, a mask insulating film 1108 made of a silicon oxide film is formed on the active layers 1106 and 1107, and an opening portion 1109 is formed by patterning. This opening portion 1109 is formed so that an active layer that becomes a source region or drain region later is exposed.

After the opening portion 1109 is formed, a germanium film 1110 is formed by a sputtering method, and the active layers 1106 and 1107 are brought into contact with the germanium film 1110. A germanium target is used for the film formation, reached pressure is set to $4\times10^{-4}$ Pa or less, sputtering gas is argon (Ar), film formation temperature is set to room temperature, film formation pressure is set to 0.4 Pa, and DC current at film formation is set to 0.4 A.

The film formation of the germanium film 1110 can also be carried out by a low pressure CVD method or plasma CVD method. Since germane ($GeH_4$) is a gas that is decomposed very easily, it is easily decomposed at a low temperature of about 450° C. to form the germanium film.

Figure 4B:
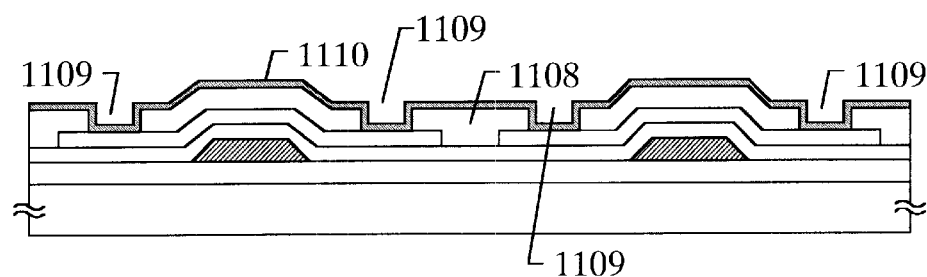
Figure 4C:
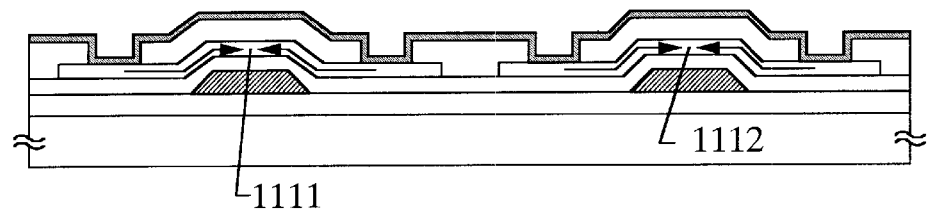

In this way, the state of FIG. 4B is obtained. Next, a heat treatment at 600° C. for 12 hours is carried out so that the amorphous silicon film is crystallized and is transformed into a polysilicon film of a crystal semiconductor film. At this time, crystallization starts at a region (opening portion) where the amorphous silicon film is in contact with the germanium film, and crystal growth in the lateral direction gradually progresses in the direction indicated by arrows (FIG. 4C).

Incidentally, when the temperature exceeds 600° C., natural nucleus generation in the amorphous silicon film increases and blocks the crystal growth progressing in the lateral direction, which is not preferable. This crystallization step may be carried out by any means of furnace annealing, lamp annealing, and laser annealing. In this embodiment, importance is attached to uniformity of the formed film and the furnace annealing is used.

It is desirable that the atmosphere of the heat treatment is an inert gas atmosphere or hydrogen atmosphere. If oxygen exists, the germanium film is easily oxidized and is transformed into an inactive germanium oxide film. Since this may damage the catalytic function and cause poor crystallization, attention must be paid.

As in this embodiment, in the case where crystal growth is made in the lateral direction by using germanium as the catalytic element, attention must be paid to the fact that the growth distance is very short. In the case of FIG. 4C, crystal growth starts just from the portions which become a source region and a drain region, and the growth meets with each other at substantially the center of a portion that becomes a channel formation region.

Thus, in order to crystallize at least the whole region of the channel formation region, the growth must be made for the distance of at least the half of the width (channel length) of the channel formation region in the direction connecting the source and drain. Since the crystal growth meets with each other at substantially the center of the channel formation region, grain boundaries (not shown) are formed at that portion.

In the case where crystal growth is made in the manner of this embodiment, although the growth distance in the lateral direction is varied depending on the temperature of the heat treatment and treatment time thereof, it appears that the growth for about 1 μm is the limit in view of throughput and device performance. In that sense, it can be said to be preferable that the size of a device to which the present invention is applied is such that the channel length is 2 μm or less, preferably 1 μm or less (of course, zero is not included).

Figure 4D:
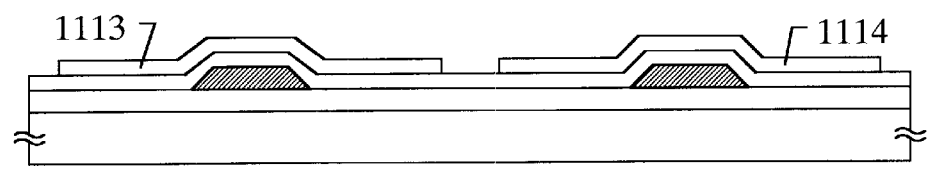

After active layers 1111 and 1112 are obtained in this way, the germanium film 1110 is removed by a sulfuric-acid peroxide solution ($H_2SO_4$:$H_2O_2$=1:1), and then, the mask insulating film 1108 is removed. Thereafter, a heat treatment at 900° C. for 30 minutes is carried out in an oxygen atmosphere (FIG. 4D).

In the present invention, the heat treatment at a high temperature (temperature higher than at least the heat treatment temperature in the crystallization step) is very important. By carrying out this step, it is possible to decrease trap levels existing in crystal grain boundaries and to greatly decrease defects lamination defects, etc.) in the crystal grains.

The present applicant considers the following model as to the above effect. There is a difference of almost ten times in thermal expansion coefficient between the polysilicon film and quartz (silicon oxide) as the under layer. Thus, at the time point when the amorphous silicon film is transformed into the polysilicon film, very large stress is generated when the polysilicon film is cooled.

Figure 11A:
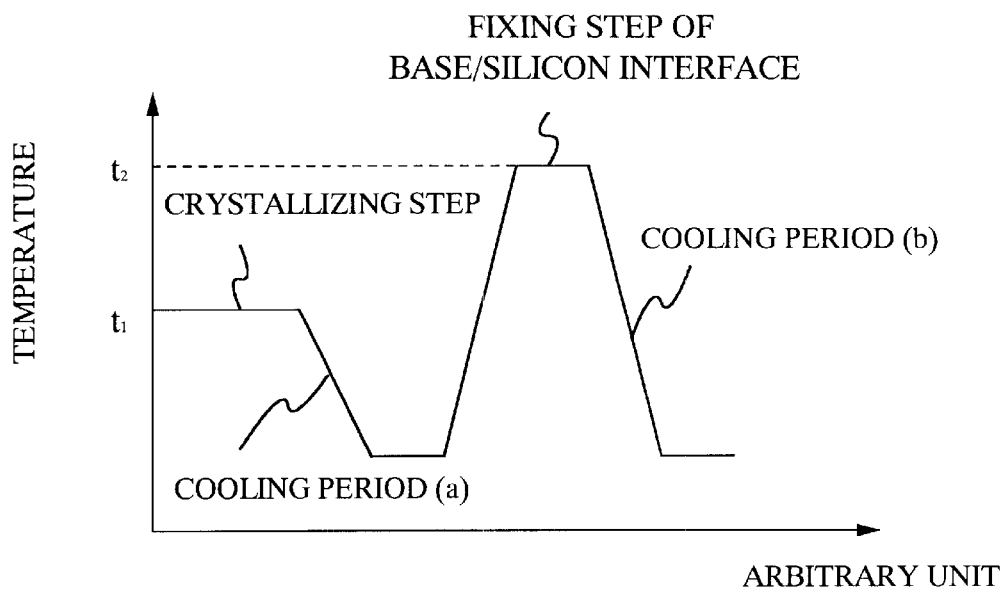
FIGS. 11A to 11C are views for explaining the outline of a fixing step of Embodiment 2.
Figure 11B:
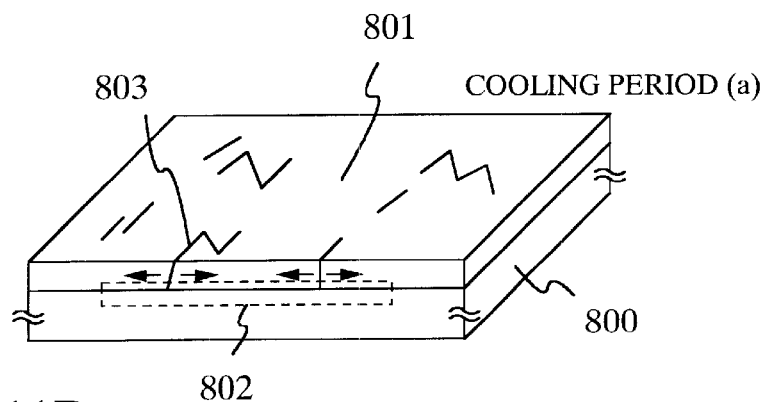
Figure 11C:
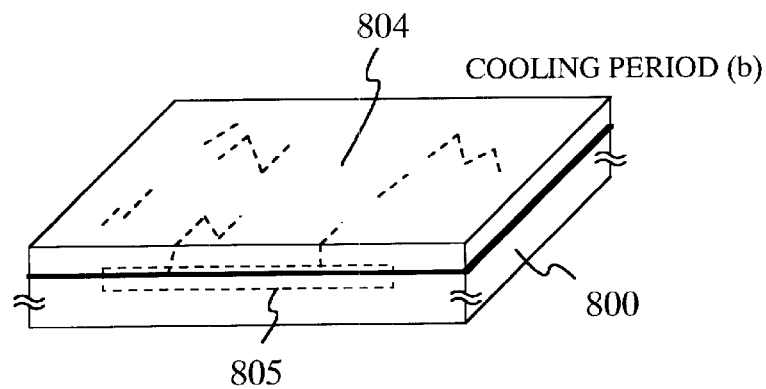

This will be described with reference to FIGS. 11A to 11C. FIG. 11A shows a heat hysteresis applied to the polysilicon film after the crystallization step. First, the polysilicon film crystallized at temperature ($t_1$) is cooled to room temperature through a cooling period FIG. 11B shows the polysilicon film in the cooling period (a). Reference numeral 800 denotes a quartz substrate, and 801 denotes a polysilicon film. At this time, adhesiveness at an interface 802 between the polysilicon film 801 and the quartz substrate 800 is not very high, and it appears that this causes a number of defects in grains.

That is, the polysilicon film pulled through the difference in thermal expansion coefficient is moved very easily on the quartz substrate 800, and it appears that defects 803, such as lamination defects or dislocations, are easily generated by force such as a tensile stress.

The thus obtained polysilicon film corresponds to the polysilicon film 1106 in FIG. 4B. Thereafter, as shown in FIG. 11A, a heat treatment at temperature ($t_2$) is carried out, and the defects (defects in grains) in the crystal grains almost disappear. It can be inferred that this phenomenon is caused because lattice interstitial silicon atoms existing among lattices are moved by this heat treatment and compensate the defects.

Since a number of such lattice interstitial silicon atoms are generated in a heat oxidation step, if the aforementioned heat treatment at a temperature exceeding the above crystallization temperature is carried out in an oxidizing atmosphere, the defects can be more effectively removed.

After the defects in grains are removed by the heat treatment in this way, the film is again cooled to room temperature through a cooling period (b). Here, the point different from the cooling period (a) after the crystallization step is that an interface 805 between the quartz substrate 800 and a polysilicon film 804 after annealing is in a state that adhesiveness is very high (FIG. 11C).

When the adhesiveness is high like this, since the polysilicon film 804 is completely fixed to the quartz substrate 800, even if stress is applied to the polysilicon film in the cooling stage of the polysilicon film, defects are not generated. That is, it is possible to prevent defects from being generated again.

Thus, when the heat treatment at the temperature higher than the heat treatment temperature in the crystallization step is carried out after the end of the crystallization, the polysilicon film is firmly fixed to the under layer at the interface therebetween, and the defects in the grains are removed, and at the same time, regeneration thereof can be prevented. The present applicant refers to this heat treatment as a fixing step of a silicon interface.

Incidentally, although FIG. 11A shows, as an example, the process in which temperature is lowered to room temperature after the crystallization step, it is also possible to carry out the fixing step by increasing the temperature immediately after the crystallization is ended. Also through such a process, it is possible to obtain a polysilicon film having similar crystallinity.

The thus obtained active layers 1113 and 1114 have the feature that the number of defects in crystal grains is extremely smaller than the active layers 1111 and 1112 which are merely crystallized. The difference in the number of defects appears as the difference in spin density by an electron spin resonance analysis (ESR).

In the present circumstances, it has been found that the spin density of the active layers 1113 and 1114 is at most $5 \times 10^{17}$ spins/cm$^3$ (preferably $3 \times 10^{17}$ spins/cm$^3$ or less). However, since this measured value is near the detection limit of an existing measuring apparatus, it is expected that the actual spin density is further low.

By using germanium as a catalytic element, abnormal oxidation of the polysilicon film in the step shown in FIG. 4D is prevented. According to the present applicant, when nickel is used as a catalyst for crystallization, there is a case where nickel silicide is concentrically oxidized and abnormal growth occurs. Although this can be prevented by carrying out thermal oxidation under the condition that silicon is not brought into direct contact with an oxidizing atmosphere, an increase in the number of steps has been caused.

However, in the present invention, since nickel is not used but germanium having high conformity with silicon is used as a catalyst, such local abnormal oxidation does not occur, and a heat treatment can be directly applied to the polysilicon film after crystallization.

Incidentally, in this embodiment, although the heat treatment is carried out at 900° C. for 30 minutes, the temperature is typically 800 to 1050° C. (preferably 850 to 900° C.), and the present invention is characterized in that the heat treatment is carried out at such a high temperature. Since it appears that a thermal oxidation mechanism greatly contributes to lowering of defects in grains, the condition is desirably such that thermal oxidation is apt to occur.

Thus, when throughput is taken into consideration, it is preferable that the lower limit temperature of the heat treatment is 800° C., and the upper limit temperature is 1050° C. in view of the heat resistance of the substrate (quartz in this embodiment). However, since the melting point of germanium is 930 to 940° C., it is more preferable that the upper limit is 900° C.

Although it is preferable that the atmosphere of the heat treatment is an oxidizing atmosphere, an inert gas atmosphere may be adopted. In the case of the oxidizing atmosphere, it is appropriate that either one of a dry oxygen ($O_2$) atmosphere, a wet oxygen ($O_2 + H_2$) atmosphere, and an atmosphere containing halogen elements ($O_2 + HCl$, etc.) is used.

Especially, when a heat treatment is carried out in the atmosphere containing halogen, by the gettering effect of the halogen element, surplus germanium existing among lattices of polysilicon are removed in the form of volatile $GeCl_4$. Thus, this is effective means for obtaining a polysilicon film with little lattice distortion.

Further, when a heat treatment at 800 to 1050° C. is carried out in an oxidizing atmosphere, a thermal oxidation film (not shown in the drawing) is formed so that the polysilicon film itself is made a thin film. When the present invention is carried out, in view of the film decrease by the thermal oxidation step, the thickness of the amorphous silicon film at film formation is determined. Appropriate design is such that the film thickness becomes 5 to 50 nm (preferably 15 to 45 nm) when the film is finally used as an active layer of a TFT. If the thickness is 5 nm or less, formation of normal source/drain contacts becomes difficult, and if the thickness exceeds 50 nm, the effect brought by thinning becomes weak.

The polysilicon film of this embodiment obtained by the manufacturing method having the structure as described above has very high crystallinity, and is an optimum semiconductor thin film as an active layer of a thin film transistor. Germanium exists in the polysilicon film of this embodiment. It was ascertained by the SIMS (Secondary Ion Mass Spectroscopy) that germanium distributes with the concentration of $1 \times 10^{14}$ to $1 \times 10^{20}$ atoms/cm$^3$ (typically $1 \times 10^{18}$ to $1 \times 10^{19}$ atoms/cm$^3$).

Incidentally, when the concentration of germanium becomes $1 \times 10^{20}$ to $1 \times 10^{22}$ atoms/cm$^3$, an alloy of silicon and germanium is formed (bandgap is also changed), and a silicon germanium layer expressed by $Si_xGe_{1-x}$ (0<X<1) is formed. The polysilicon film of this embodiment has the feature that although it is the same as the silicon germanium film in that germanium is contained, it is different from the silicon germanium film in that an alloy is not formed.

After the active layers 1113 and 1114 are obtained in this way, a silicon oxide film with a thickness of 120 nm is formed and is patterned to form spacer insulating layers 1115 and 1116. After the spacer insulating layers 1115 and 1116 are formed, an impurity element (phosphorus in this embodiment) for giving an n-type is added to form n-type impurity regions 1117 (FIG. 4E).

In this embodiment, a plasma doping method is used and phosphine ($PH_3$) is used as a doping gas. It is appropriate that the addition is carried out under the condition that the acceleration voltage is 10 kV, and the dosage is $5 \times 10^{14}$ atoms/cm$^2$. Incidentally, it is not necessary to limit the doping condition to this embodiment, but the condition may be changed according to the necessity.

Figure 4E:
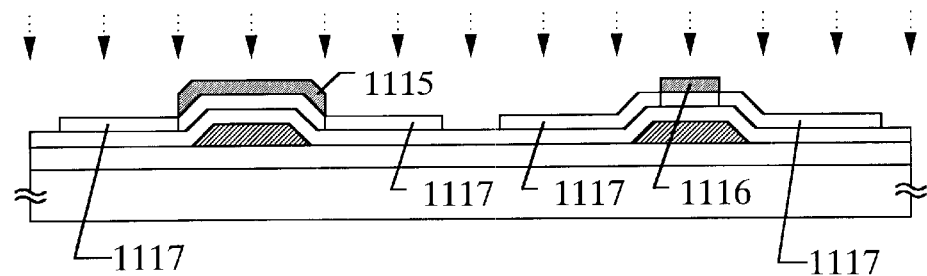

After the state of FIG. 4E is obtained in this way, a resist mask 116 is selectively provided, and a second n-type impurity adding step is carried out. The resist mask 116 is formed, in a region that becomes the NTFT, above a region where a channel formation region is formed later, and is formed in a region that becomes the PTFT so that the n-type impurity is not added to the region (FIG. 2A).

Here, the acceleration voltage is set to 90 kV that is slightly higher than that in the former case, and the dosage is set to $3 \times 10^{13}$ atoms/cm$^2$. At this acceleration voltage, the spacer insulating layers 1115 and 1116 do not function as masks, the impurity ions are added also in the silicon film under the end (region that is not covered with the resist mask 116) of the spacer insulating layer.

By this step, a source region 117, a drain region 118, a pair of LDD regions (low concentration impurity regions) 119, and a channel formation region 120 of the NTFT are defined. Incidentally, since the second doping step is also a formation step of the LDD regions as it is, it is necessary for an operator to suitably determine an optimum amount of doping for the LDD regions.

Next, after the resist mask 116 is removed, the region that becomes the NTFT is completely covered with the resist mask 121, and an impurity element (boron in this embodiment) for giving a p-type is added. Here, diborane ($B_2H_6$) is used as a doping gas, acceleration voltage is set to 10 kV, and dosage is set to $1.3 \times 10^{15}$ atoms/cm$^2$ (FIG. 2B).

In this step, since the spacer insulating layer 1116 completely functions as a mask, any impurity is not added in the region under the layer, and the spacer insulating layer 1116 directly defines a source region 122, a drain region 123, and a channel formation region 124. In the step of FIG. 4E, although phosphorus is added also in the region that becomes the PTFT, the conductivity is inverted into a p-type by this step.

After the adding step of impurity ions for forming the source region, the drain region, and the LDD region in this way, the resist mask 121 is removed, and an activation step of impurity is carried out. In this embodiment, although activation is made by irradiation of excimer laser light, furnace annealing or lamp annealing may be used. Of course, they may be used at the same time.

Incidentally, the spacer insulating layers 1115 and 1116 may be removed before the activation step of impurity. Efficiency of activation by irradiation of laser light is greatly improved by the removal. However, if the spacer insulating layer is removed, the channel formation region is exposed, so that it is preferable to remain the layer as possible (FIG. 2C).

Next, an interlayer insulating film 125 made of a silicon oxide film is formed, contact holes are formed, and source wiring lines 126 and 127, and a drain wiring line 128 are formed. At this time, it is necessary to form a contact hole (not shown) for electrical connection between a gate wiring line connected to the gate electrode and the source wiring line (or drain wiring line) at the same time.

Finally, the entirety is subjected to a heat treatment at approximately 350° C. for 2 hours in a hydrogen atmosphere, so that dangling bonds in the film (especially in the channel formation region) are terminated with hydrogen. Through the above steps, the CMOS circuit with a structure as shown in FIG. 2D is completed.

One of the features of the TFT manufactured through the steps of this embodiment is that the concentration of germanium in the source region or drain region is higher than that in the channel formation region. This is because at the crystallization, the amorphous silicon film is brought into contact with the germanium film at the region that becomes the source region or drain region later.

Since the channel formation region is not subjected to such a step that the crystallinity is disturbed in a subsequent step to the formation of the active layer, the region keeps the superior crystallinity that the spin density is $5 \times 10^{17}$ spins/cm$^3$ or less as it is.

In the present invention, a circuit is constituted of the inverted stagger type TFTs manufactured through the steps as described above. Incidentally, the manufacturing steps of this embodiment are merely one example for carrying out the present invention, and the invention is not limited to this.

Although this embodiment does not adopt, an operator may suitably make such a contrivance that channel doping to the NTFT and PTFT is carried out to control a threshold voltage.

In the inverted stagger type TFT manufactured in accordance with the steps of this embodiment, the mobility (field effect mobility) as a typical electric characteristic is 200 to 350 cm$^2$/Vs for an NTFT and 150 to 250 cm$^2$/Vs for a PTFT, and the S value (subthreshold coefficient) is 70 to 200 mV/decade for both the NTFT and PTFT.

The important point in the structure of the present invention is to crystallize an amorphous silicon film by using germanium as a catalyst, and this structure is not limited to the structure of a TFT. Thus, the present invention can be applied to a top gate type TFT'such as a planar type TFT or stagger type TFT.

[Embodiment 3]

In this embodiment, an example of an inverted stagger type TFT manufactured through steps different from the embodiment 1 or 2 will be described with reference to FIGS. 3A to 3E.

First, in accordance with the steps of embodiment 1, steps up to FIG. 1C are ended. In this embodiment, in the step of FIG. 1C, after active layers 111 and 112 made of polysilicon films are obtained, a germanium film 110 and a mask insulating film 108 are removed and a heat treatment with excimer laser light is carried out.

Figure 3A:
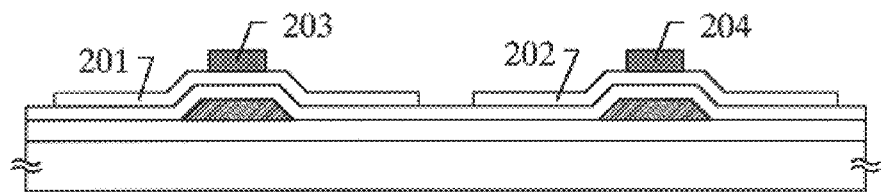
FIGS. 3A to 3E are views showing manufacturing steps of a thin film transistor of Embodiment 3.

Next, spacer insulating layers 203 and 204 made of silicon oxide films are formed on active layers 201 and 202 the crystallinity of which is improved by the laser light irradiation. The width of the spacer insulating layer determines the width of a channel formation region later (FIG. 3A).

Alternatively, in accordance with steps of the embodiment 2, steps up to FIG. 4D are ended. Through the steps up to this, the active layers 201 and 202 which can be regarded as substantially single crystal are obtained. Next, the spacer insulating layers 203 and 204 made of silicon oxide films are formed on the active layers 201 and 202. The width of the spacer insulating layer determines the width of the channel formation region later (FIG. 3A).

Figure 3B:
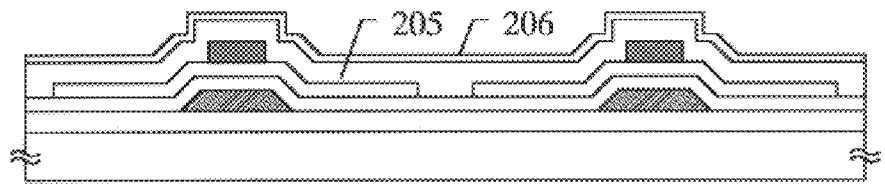

Next, an amorphous silicon film 205 with a thickness of 100 nm is formed by using a plasma CVD method or low pressure CVD method, and a microcrystal silicon film 206 with a thickness of 50 nm is formed thereon (FIG. 3B).

The film forming condition of the amorphous silicon film 205 is such that a mixed gas of $SiH_4$ of 100 sccm and $H_2$ of 300 sccm is used as a film forming gas, film formation pressure is 0.75 torr, and applied power is 20 W. The film formation condition of the microcrystal silicon film 206 is such that a mixed gas of $SiH_4$ of 5 sccm and $H_2$ of 500 sccm is used as a film forming gas, film formation pressure is 0.75 torr, and applied power is 300 W.

Figure 3C:
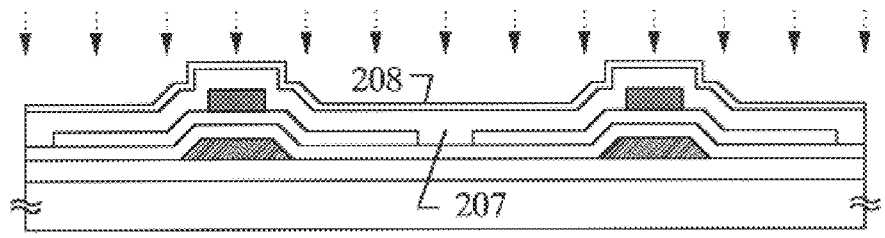

Next, an impurity element (phosphorus in this embodiment ) for giving an n-type is added to the amorphous silicon film 205 and the microcrystal silicon film 206, so that an n-type amorphous silicon film 207 and an n-type microcrystal silicon film 208 are obtained (FIG. 3C).

At this time, the adding condition of phosphorus is such that acceleration voltage is set to 10 kV and dosage is $5 \times 10^{14}$ atoms/cm$^2$. Since the n-type semiconductor layer of a laminated structure of the amorphous silicon film 207 and the microcrystal silicon film 208 functions as an electrode for drawing carriers from the active layer, it is sufficient if the layer has conductivity to satisfy that. Thus, it is not necessary to limit to the values adopted in the manufacturing steps of this embodiment.

The microcrystal silicon film is provided as the uppermost layer in order to easily make ohmic contact with a subsequently formed wiring layer made of a conductive film. Although it is difficult to make excellent ohmic contact between the amorphous silicon film and the conductive film, ohmic contact with an acceptable level can be obtained between the microcrystal silicon film and the conductive film.

Figure 3D:
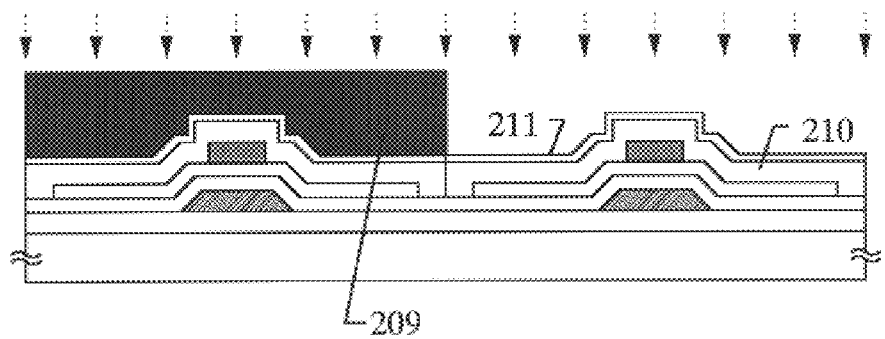

Next, the region that becomes the NTFT is covered with a resist mask 209, and an impurity element (boron in this embodiment) for giving a p-type is added. By this step, in the region that becomes the PTFT, the n-type semiconductor layer formed before is inverted so that a p-type semiconductor layer comprising a p-type amorphous silicon film 210 and a p-type microcrystal silicon film 211 is formed (FIG. 3D).

At this time, the adding condition of boron is such that acceleration voltage is set to 10 kV and dosage is $1.3 \times 10^{15}$ atoms/cm$^2$. Also in this case, similarly to the previous case, it is satisfactory if sufficient conductivity to draw carriers from the active layer is obtained.

After the adding step of the impurity element is ended, the resist mask 209 is removed, and a furnace annealing process at 350° C. for one hour is carried out to conduct a hydrogenating step. In this embodiment, this hydrogenating step serves also as an activation step of the previously added impurity.

In this embodiment, although the n-type semiconductor layer and the p-type semiconductor layer are formed by addition of impurities, it is also possible to add an impurity for giving an n-type or p-type in a film forming gas when the semiconductor layer is formed.

Next, a resist mask (not shown) having an opening portion is provided in a part (a part electrically connected to a subsequently formed wiring line) of a gate wiring line connected to a gate electrode. Then, the microcrystal silicon film, the amorphous silicon film and the gate insulating film are subsequently etched by dry etching to form a contact hole (not shown). The dry etching may be carried out within a well known technical range.

Then, the not-shown resist mask is removed, a conductive film made of a material containing aluminum as its main ingredient is formed on the n-type semiconductor layer and the p-type semiconductor layer, and patterning is carried out to form source wiring lines 212 and 213 and a drain wiring line 214. At this time, the gate wiring line is electrically connected to the source wiring line (drain wiring line) through the previously formed contact hole.

Further, etching of the n-type semiconductor layer and p-type semiconductor layer is carried out by using these wiring lines as masks. The condition of this etching may be the same as that at the formation of the contact hole. However, it is necessary to set the condition such that the semiconductor layer can be etched without etching the wiring line.

Figure 3E:
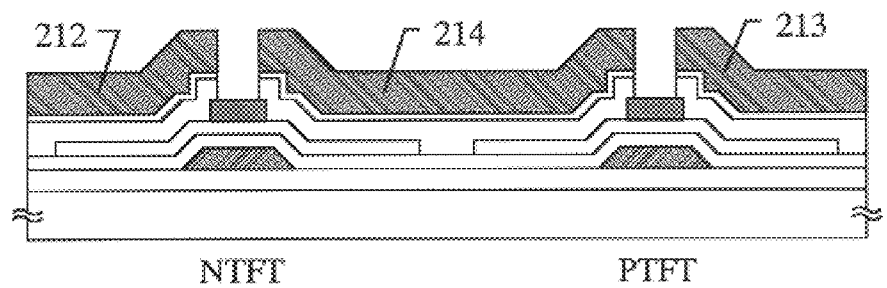

The etching of the semiconductor layer stops at the spacer insulating layers 203 and 204, and the source wiring line and the drain wiring line are completely electrically separated from each other. When steps up to this are ended, hydrogenating is carried out in a hydrogen atmosphere so that the CMOS circuit with the structure shown in FIG. 3E is completed.

In the structure of this embodiment, the inverted stagger type TFT can be manufactured with less number (seven) of masks than in the embodiment 1 by one. By this, it is possible to increase yield and to lower manufacturing cost. Of course, the electrical characteristics of the TFT of this embodiment are by no means inferior to the TFT manufactured in the embodiment 1 or 2.

[Embodiment 4]

In this embodiment, description will be made on a case where, instead of forming a germanium film in the embodiment 1, a layer containing germanium is formed by a solution coating method (spin coating method).

In this embodiment, a solution containing germanium is applied to a mask insulating film with an opening portion to make a state in which germanium is held on an amorphous silicon film exposed at the bottom of the opening portion. As the solution, there are listed solutions of germanium oxide (GeO$_x$, typically GeO$_2$), germanium chloride (GeCl$_4$), germanium bromide (GeBr$_4$), germanium sulfide (GeS$_2$), and germanium acetate (Ge(CH$_3$CO$_2$)).

According to circumstances, as a solvent, an alcoholic solvent such as ethanol or isopropyl alcohol may be used.

Such a solution with a concentration of 100 to 1000 ppm is prepared, applied and spin dried, so that a layer containing germanium is formed on the amorphous silicon film. Since the amorphous silicon film shows hydrophobicity, it is preferable to increase wettability by forming a thin silicon oxide film before spin coating.

After the spin coating is ended, a heat treatment for crystallization is carried out in that state, so that a polysilicon film is obtained. Since germanium with a high concentration exists on the surface of the polysilicon film, it is appropriate that the surface is cleaned by an etchant such as hydrofluoric acid.

When the structure of this embodiment is applied to the embodiment 1, 2 or 3, the TFT as shown in FIG. 2D or FIG. 3E can be easily manufactured.

[Embodiment 5]

When germanium is added in an amorphous silicon film, it is also possible to use an ion implantation method, plasma doping method, or laser doping method.

As an exciting gas, it is appropriate that germane (GeH$_4$) is used, and germanium is preferably adjusted to be added in the amorphous silicon film in concentration of $1 \times 10^{14}$ to $5 \times 10^{19}$ atoms/cm$^3$ (typically $1 \times 10^{16}$ to $1 \times 10^{18}$ atoms/cm$^3$).

Unless the concentration of germanium added in the amorphous silicon film is $1 \times 10^{14}$ atoms/cm$^3$ or more (preferably $1 \times 10^{16}$ atoms/cm$^3$ or more), it is not possible to effectively use the facilitating effect for crystallization as a catalyst. If the amount of addition is excessively large, the property approaches that of a germanium film and TFT characteristics are lowered. Thus, it is desirable to keep the amount not higher than approximately $5 \times 10^{19}$ atoms/cm$^3$, preferably below $1 \times 10^{18}$ atoms/cm$^3$.

The amorphous silicon film added with germanium is easily crystallized by a heat treatment at 450 to 650° C. It appears that the polysilicon film obtained in this embodiment contains many bonds in which silicon atoms are substituted by germanium atoms, and the film becomes so-called silicon germanium (expressed by Si$_x$Ge$_{1-x}$).

Since such a silicon germanium film has a band gap narrower than a silicon film, it is known that the mobility of a carrier (electron or hole) is improved. However, since there is a case where the TFT characteristics are greatly changed according to the content of germanium, attention must be paid.

When the structure of this embodiment is applied to the embodiment 1, 2 or 3, the TFT as shown in FIG. 2D or FIG. 3E can be readily manufactured.

[Embodiment 6]

Figure 5A:
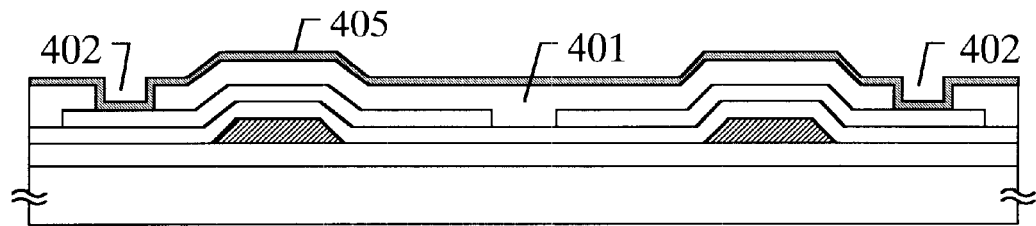
FIGS. 5A and 5B are views showing manufacturing steps of a thin film transistor of Embodiment 6.

In this embodiment, differently from the embodiment 1 in which crystal growth is made form both ends of an active layer, a case where crystal growth is made from one end portion (portion that becomes a source region or drain region) of an active layer, will be described with reference to FIGS. 5A and 5B.

After the formation of a mask insulating film 401 is ended in accordance with steps of the embodiment 1, an opening portion 402 is formed by patterning. This opening portion 402 is selectively provided in only a portion that becomes a source region later, and is formed so that only one end portion of an active layer is exposed. Then, a germanium film 405 is formed thereon by a plasma CVD method (FIG. 5A).

Next, in this state, a heat treatment at 600° C. for 8 hours is carried out, so that an amorphous silicon film is crystallized into a polysilicon film. At this time, crystal growth progresses in the direction of arrows, and active layers 403 and 404 made of the polysilicon film are formed (FIG. 5B).

Incidentally, as described in the embodiment 1, since the limit of growth distance in the lateral direction is about 1 μm, it is desirable in this embodiment that the channel length is at most 1 μm, preferably 0.5 μm or less (of course, zero is not included).

Figure 5B:
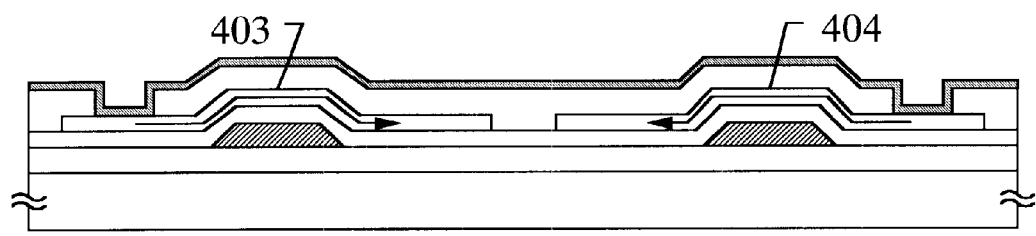

After the state of FIG. 5B is obtained in this way, it is appropriate that a TFT is completed through similar steps to the embodiment 1. Of course, the structure like the embodiment 3 may be adopted, and the structure of the embodiment 4 or 5 may be applied.

[Embodiment 7]

Figure 7A:
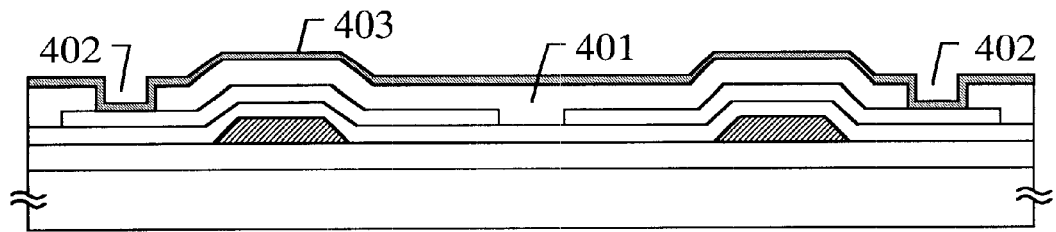
FIGS. 7A and 7B are views showing manufacturing steps of a thin film transistor of Embodiment 7.

In this embodiment, unlike the embodiment 2 in which crystal growth is made from both ends of an active layer, a case where crystal growth is made from one end portion (portion which becomes a source region or drain region) of an active layer, will be described with reference to FIGS. 7A and 7B.

After the formation of a mask insulating film 301 is ended in accordance with steps of the embodiment 2, an opening portion 302 is formed by patterning. This opening portion 302 is selectively provided in only a portion that becomes a source region later, and is formed so that only one end portion of an active layer is exposed. Then, a germanium film 305 is formed thereon by a plasma CVD method (FIG. 7A).

Next, in this state, a heat treatment at 600° C. for 8 hours is carried out, so that an amorphous silicon film is crystallized into a polysilicon film. At this time, crystal growth progresses in the direction of arrows, and active layers 303 and 304 made of the polysilicon film are formed (FIG. 7B).

Incidentally, as set forth in the embodiment 2, since the limit of growth distance in the lateral direction is about 1 μm, it is desirable in this embodiment that the channel length is at most 1 μm, preferably 0.5 μm or less (of course, zero is not included).

Figure 7B:
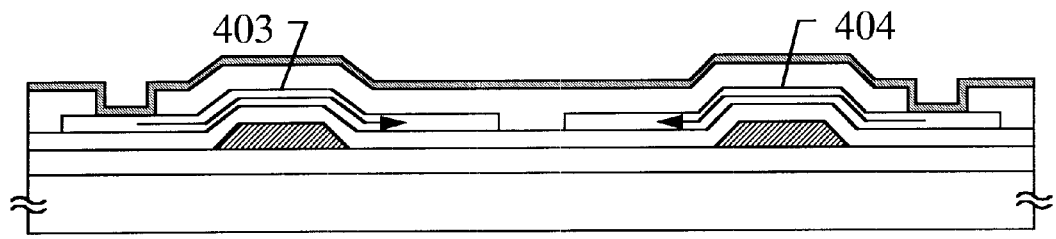

After the state of FIG. 7B is obtained in this way, it is appropriate that a TFT is completed through steps similar to the embodiment 2. Of course, the structure like the embodiment 3 may be adopted, or the structure of the embodiment 4 or 5 may be applied.

[Embodiment 8]

In the case where a crystallizing step using germanium as a catalytic element is carried out, attention must be paid to the oxygen content in a processing atmosphere at crystallization. As described in the embodiments 1 and 2, since germanium is easily oxidized into inactive germanium oxide, it is necessary to remove oxygen as possible.

For that reason, it is desirable to continuously carry out steps of (1) cleaning the surface of an amorphous silicon film, (2) forming a germanium film, and (3) crystallizing by a heat treatment, without exposing to the air.

Figure 12A:
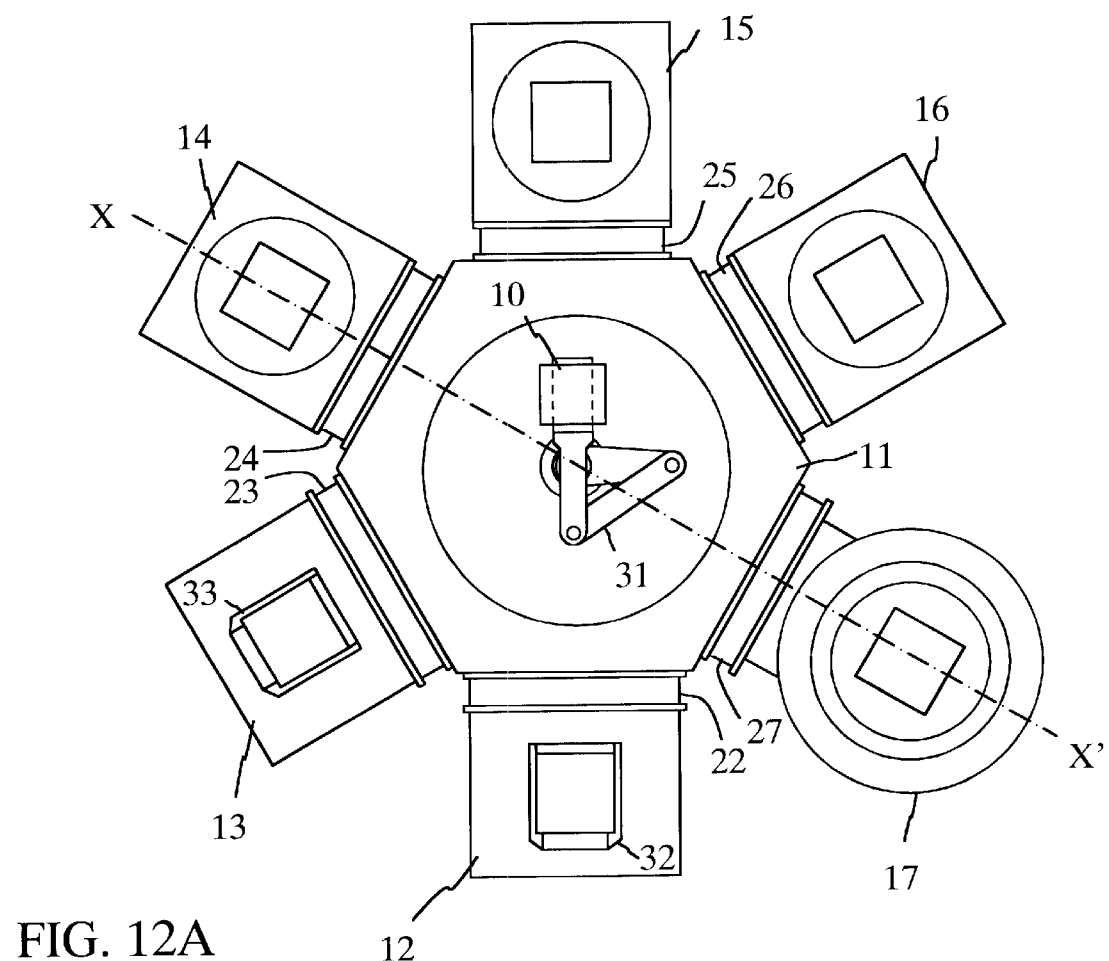
FIGS. 12A and 12B are views showing the structure of a multi-chamber system processing apparatus of Embodiment 8.
Figure 12B:
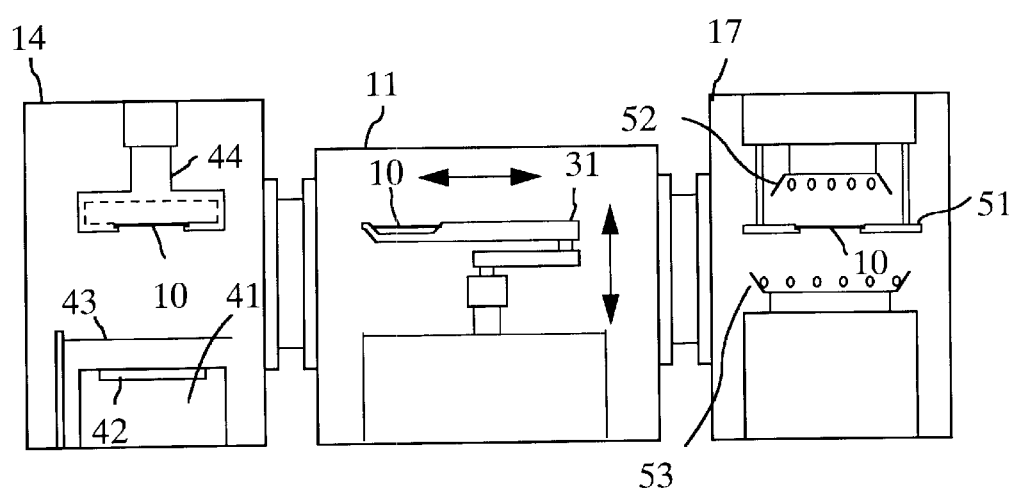

In this embodiment, such steps are carried out using a multi-chamber (cluster tool) system processing apparatus. A processing apparatus used in this embodiment is shown in FIGS. 12A and 12B. FIG. 12A is a top view and FIG. 12B is a sectional structural view taken along the broken line X-X' in FIG. 12A.

Reference numeral 11 denotes a common chamber of the apparatus, 12 and 13 denote load lock chambers, 14 and 15 denote sputtering chambers, 16 denotes an etching chamber, and 17 denotes a heating chamber. The respective chambers 12 to 17 are connected to the common chamber 11 through a gate valve, and airtightness can be kept for each of the chambers 11 to 17.

An exhaust system (not shown) for making a decompressed state and a gas supply system (not shown) for supplying an atmosphere controlling gas and a sputtering gas are provided for each of the chambers 11 to 17. A cryopump for realizing an ultimate vacuum of $10^{-6}$ Pa is provided for the exhaust system of each of the sputtering chambers 14 and 15 and the etching chamber 16.

A robot arm 31 for transferring a processed substrate 10 into the chambers 12 to 17 is provided in the common chamber 11. A substrate holding portion of the robot arm 31 is three-dimensionally movable as indicated by arrows. The robot arm 31 is of a facedown system in which the processed substrate 10 is transferred while its component formation surface is faced downward, so that dust like particles is prevented from adhering to the component formation surface.

The load lock chambers 12 and 13 are chambers for transferring the processed substrate 10 in and out of the apparatus. The processed substrate 10 is contained in a substrate transfer cassette 32 or 33, and is transferred in or out of the apparatus.

The sputtering chambers 14 and 15 have almost the same structure, and the structure of the sputtering chamber 14 will be described with reference to FIG. 12B. In this embodiment, a germanium film is formed in the sputtering chamber 14 or 15.

In the sputtering chamber 14, there are provided a target support 41, a target 42, a shutter 43, and a facedown system substrate holder 44. The substrate holder 44 is designed such that an end of several mm of the processed substrate 10 is supported, and pollution of the substrate 10 is as small as possible.

A DC current is supplied to the target 42 through the target support 41 from a not-shown DC power source. The specification of the gas supply system and the like are determined according to a material formed into a film in the sputtering chamber 14 or 15.

In this embodiment, although the etching chamber 16 has almost the same structure as the sputtering chambers 14 and 15, an RF power source is connected thereto instead of the DC power source, so that RF power is supplied to the substrate 10 and a negative self-bias voltage is applied.

In this embodiment, the surface of the amorphous silicon film is slightly sputtered (surface layer is etched) with a rare gas (argon, helium, etc.) in the etching chamber 16, so that surface cleaning is carried out and the surface of the amorphous silicon film is cleaned.

The heating chamber 17 is a chamber for a crystallization step, and such a structure is adopted that an RTA process can be made as heating means in view of throughput. There are provided a facedown system substrate holder 51 and heating lamps 52 and 53 for irradiating with an infrared light to heat the substrate 10 from its both surfaces. The heat lamp 53 is a main lamp for heating the main surface of the substrate.

A method of using the processing apparatus shown in FIGS. 12A and 12B in this embodiment will be described below. The substrate to be processed (substrate with a mask insulating film formed on an amorphous silicon film) 10 is transferred from the load lock chamber 12 into the sputtering apparatus. After the load lock chamber 12 is made a decompressed state, the chamber is set under a nitrogen atmosphere. The common chamber 11, the sputtering chambers 14 and 15, and the etching chamber 16 are also made a decompressed state, and the reached pressure is made $10^{-6}$ Pa.

A gate valve 22 is opened, and the substrate 10 is transferred by the robot arm 31 into the etching chamber 16. In order to avoid mixing of atmospheres, two gate valves 22 and 27 are controlled so as not to be opened at the same time. The same is the case in the following. The substrate is fixed to the substrate holder in the etching camber 16, and a sputtering process with argon gas is carried out while applying RF power to the substrate. By the sputtering process, impurities and natural oxidation films on the surface of the amorphous silicon film are removed.

Next, the substrate 10 is transferred into the sputtering chamber 14 and a germanium film is formed. Then the substrate is transferred into the heating chamber 17. The inside of the heating chamber 17 is set under a nitrogen atmosphere, and the substrate is heated by the heating lamps 52 and 53, so that the amorphous silicon film is crystallized. After the crystallization step is ended, the substrate is transferred into the cassette 33 in the load lock chamber 13, and is transferred out of the sputtering apparatus.

It is also effective, for the purpose of suppressing oxidation of the germanium film as possible, that, prior to the crystallization step, a germanium film is formed in the sputtering chamber 14, and an insulating film such as a silicon nitride film and a silicon nitride oxide film is then formed on the germanium film in the sputtering chamber 15 to cover the surface of the germanium film.

The structure that the crystallization step is carried out without exposing the surface of the germanium film directly to a processing atmosphere by covering the same with the insulating film, is not only used in a multi-chamber system processing apparatus as in this embodiment, but also is an effective technique especially in a case where the crystallization step is required to be carried out in an external electric heating furnace. Of course, this structure is readily combined with the structure shown in the embodiments 1 to 7.

[Embodiment 9]

Figure 6:
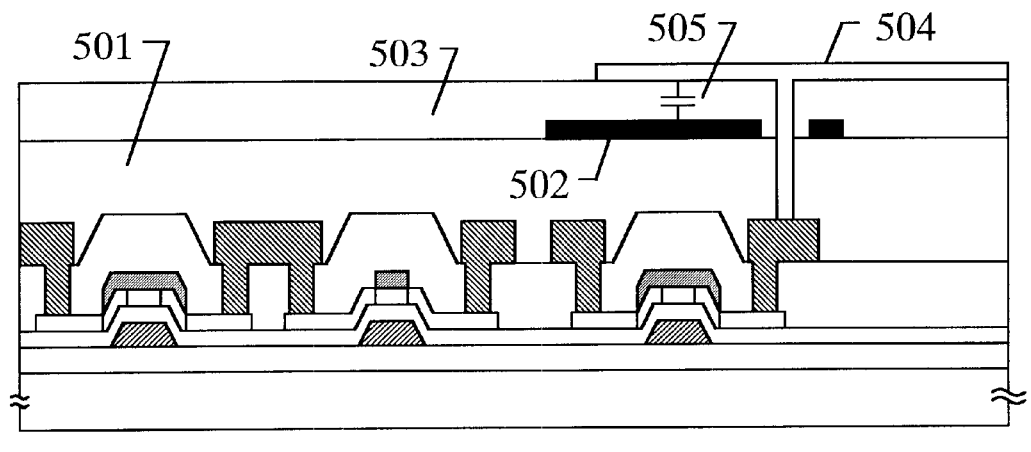
FIG. 6 is a view showing the structure of an active matrix type liquid crystal display device of Embodiment 9.

In this embodiment, an example in which a plurality of TFTs are formed on a glass substrate so that an active matrix type liquid crystal display device having an integrally formed driver circuit and pixel matrix circuit is manufactured, will be described with reference to FIG. 6.

The structure of this embodiment can be realized by adding some additional steps to the steps of the embodiment 1. First, in accordance with the steps of the embodiment 1, the state of FIG. 2D is obtained. At this time, NTFTs arranged in matrix are formed in advance in a region that becomes a pixel matrix circuit.

A polyimide film with a thickness of 1 $\mu$m as a first leveling film 501 is formed thereon. Other than polyimide, other organic resin materials such as acryl may be used. Next, a black mask 502 made of a conductive film of titanium or the like is formed.

Further, as a second leveling film 503, a polyimide film with a thickness of 500 nm is formed. After the second leveling film 503 is formed, a contact hole is formed and a pixel electrode 504 made of a transparent conductive film (typically an indium tin oxide (ITO) film) is formed.

At this time, an auxiliary capacitance 505 with the second leveling film as a dielectric is formed between the black mask 502 and the pixel electrode 504.

Through the steps as described above, the structure shown in FIG. 6 is completed. An actual active matrix type liquid crystal display device is completed by forming an orientation film after formation of the pixel electrode and by holding a liquid crystal between the pixel electrode and an opposite electrode. Since these cell assembling steps can be made by using well known means, their explanation is omitted.

Figure 9:
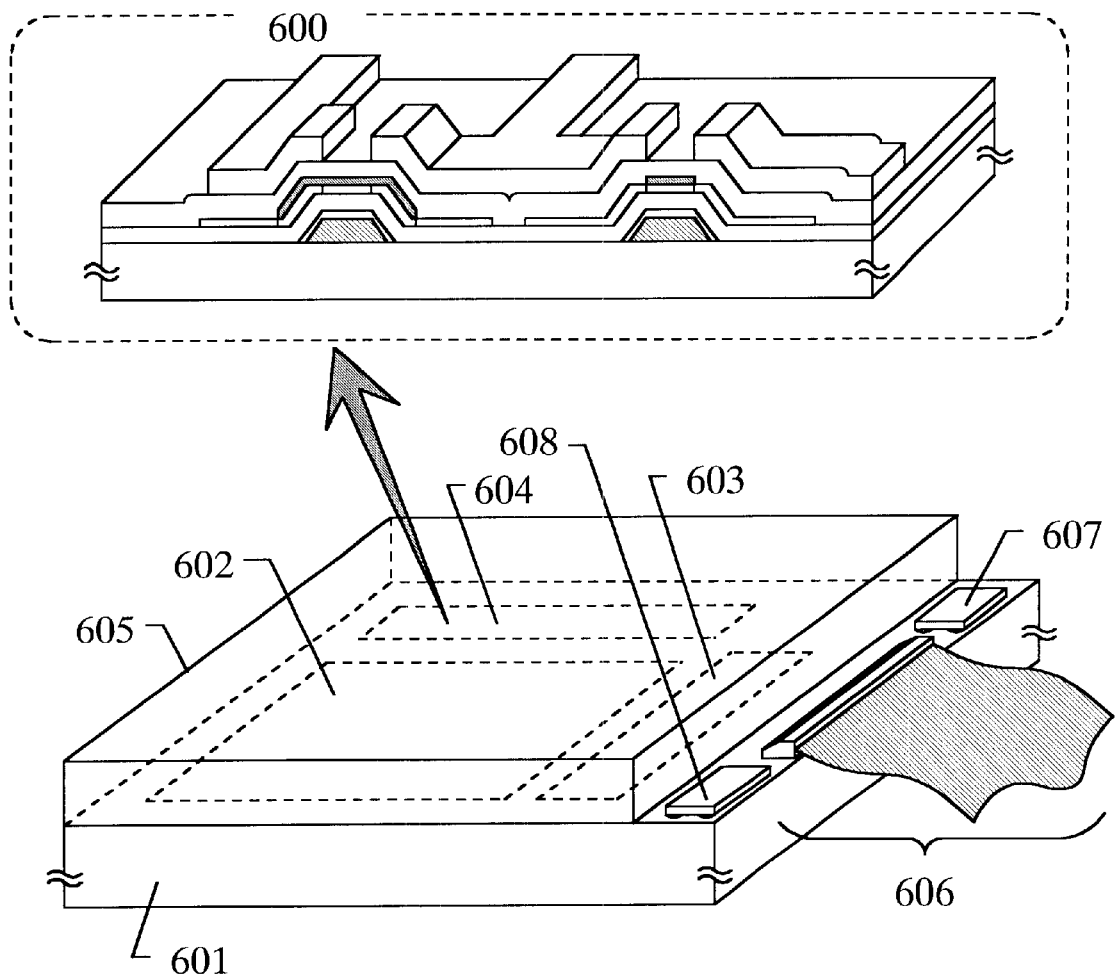
FIG. 9 is a view showing the structure of an active matrix type liquid crystal display device of Embodiments 9 and 10.

FIG. 9 schematically shows the outer appearance of the active matrix type liquid crystal display device formed in this way. In FIG. 9, reference numeral 601 denotes a substrate having an insulating surface, 602 denotes a pixel matrix circuit, 603 denotes a source driver circuit, 604 denotes a gate driver circuit, 605 denotes an opposite electrode, 606 denotes an FPC (Flexible Printed Circuit), and 607 and 608 denote external IC chips.

At this time, for example, the source driver circuit 603 or the gate driver circuit 604 is constituted of a CMOS circuit denoted by 600.

In this embodiment, if the pixel electrode is made of a material having high reflectivity, a reflection type liquid crystal display device can be easily manufactured.

As described above, when various circuits are formed by using TFTs manufactured by using the present invention, an electro-optical device including a circuit on a substrate can be realized. In this embodiment, although a liquid crystal display device is shown as an example, it is also possible to manufacture an EL (electroluminescence) display device, an image sensor and the like.

[Embodiment 10]

Figure 8:
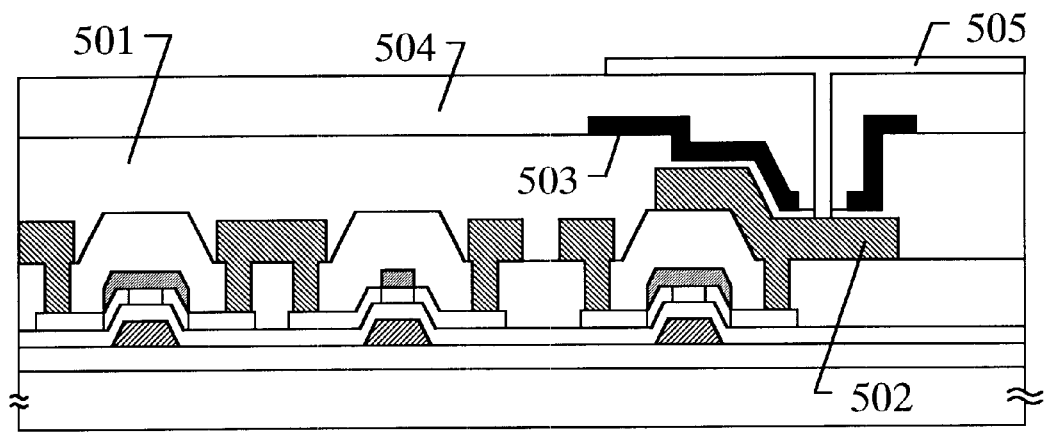
FIG. 8 is a view showing the structure of an active matrix type liquid crystal display device of Embodiment 10.

In this embodiment, an example in which a plurality of TFTs are formed on a glass substrate by using the present invention so that an active matrix type liquid crystal display device having an integrally formed driver circuit and a pixel matrix circuit is manufactured, will be described with reference to FIG. 8.

The structure of this embodiment can be realized by adding some additional steps to the steps of the embodiment 2. First, in accordance with the steps of the embodiment 2, the state of FIG. 2D is obtained. At this time, NTFTs arranged in matrix are formed in advance in a region that becomes a pixel matrix circuit.

Formed thereon is a laminated film of a silicon nitride film with a thickness of 50 nm, a silicon oxide film with a thickness of 25 nm, and a polyimide film with a thickness of 1 $\mu$m as a first leveling film 701. Other than polyimide, other organic resin materials such as acryl may be used.

Next, an opening portion is provided above a drain electrode 702 of a TFT constituting the pixel matrix circuit. At the opening portion, etching of the polyimide film and the silicon oxide film is made in sequence from the above, and the silicon nitride film of the lowermost layer is remained. After the opening portion is formed, a black mask 703 made of a conductive film of titanium or the like is formed.

Further, as a second leveling film 704, a polyimide film with a thickness of 500 nm is formed. After the second leveling film 704 is formed, a contact hole is formed in the first and second leveling films and a pixel electrode 705 made of a transparent conductive film (typically an ITO film) is formed.

At this time, an auxiliary capacitance with the above described silicon nitride film with a thickness of 50 nm as a dielectric is formed between the drain electrode 702 and the black mask 703. According to the structure of this embodiment, since the auxiliary capacitance is formed above the TFT, an opening ratio is not impaired.

Through the steps as described above, the structure shown in FIG. 8 is completed. An actual active matrix type liquid crystal display device is completed by forming an orientation film after formation of the pixel electrode and by holding a liquid crystal between the pixel electrode and an opposite electrode. Since these cell assembling steps can be made by using well known means, their explanation is omitted.

FIG. 9 schematically shows the outer appearance of the active matrix type liquid crystal display device formed in this way. In FIG. 9, reference numeral 601 denotes a substrate having an insulating surface, 602 denotes a pixel matrix circuit, 603 denotes a source driver circuit, 604 denotes a gate driver circuit, 605 denotes an opposite electrode, 606 denotes an FPC (Flexible Printed Circuit), and 607 and 608 denote external IC chips.

At this time, for example, the source driver circuit 603 or the gate driver circuit 604 is constituted of a CMOS circuit denoted by 600.

In this embodiment, if the pixel electrode is made of a material having high reflectivity, a reflection type liquid crystal display device can be easily manufactured.

As described above, when various circuits are formed by using TFTs manufactured by using the present invention, an electro-optical device including a circuit on a substrate can be realized. In this embodiment, although a liquid crystal display device is shown as an example, it is also possible to manufacture an EL (electroluminescence) display device, an image sensor and the like.

[Embodiment 11]

The electro-optical device shown in the embodiment 9 or 10 is used for a display of various electronic apparatus. As such electronic apparatus, a video camera, a still camera, a projector, a projection TV, a head mount display, a car navigation system, a personal computer, a portable information terminal (mobile computer, portable telephone, etc.) and the like are enumerated. Examples of those are shown in FIGS. 10A to 10F.

Figure 10A:
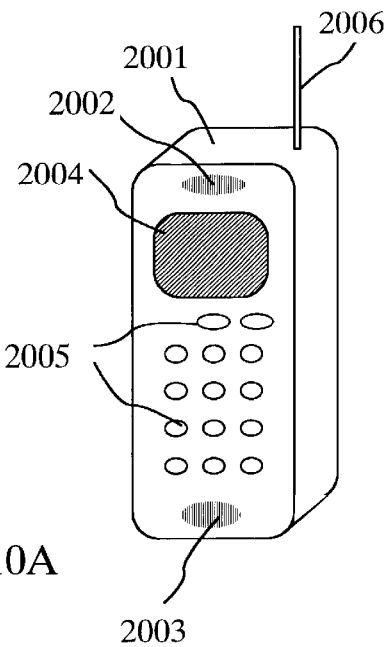
FIGS. 10A to 10F are views showing structures of electronic apparatus of Embodiment 11.

FIG. 10A shows a portable telephone that is constituted of a main body 2001, a voice output portion 2002, a voice input portion 2003, a display device 2004, an operation switch 2005, and an antenna 2006. The present invention can be applied to the display device 2004 and the like.

Figure 10B:
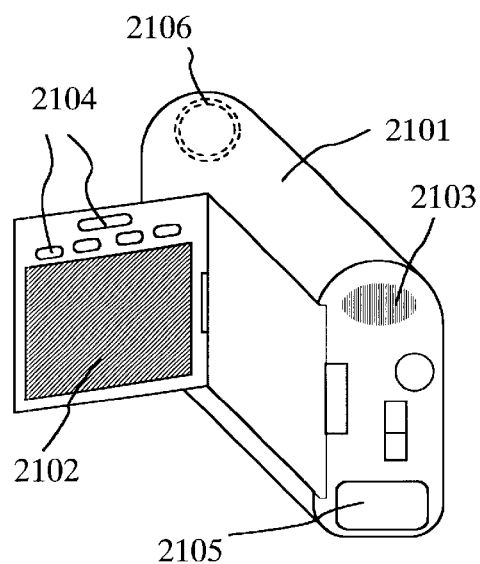

FIG. 10B shows a video camera that is constituted of a main body 2101, a display device 2102, an audio input portion 2103, an operation switch 2104, a battery 2105, and an image receiving portion 2106. The present invention can be applied to the display device 2102.

Figure 10C:
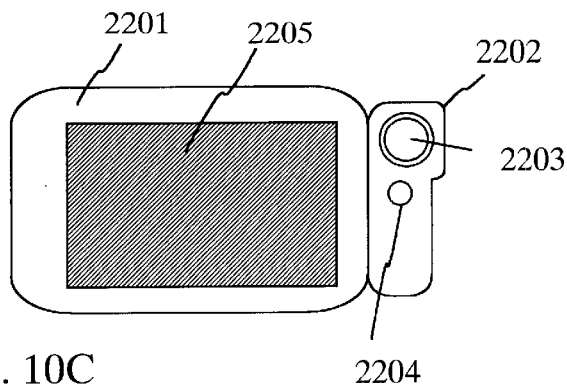

FIG. 10C shows a mobile computer that is constituted of a main body 2201, a camera portion 2202, an image receiving portion 2203, an operation switch 2204, and a display device 2205. The present invention can be applied to the display device 2205 and the like.

Figure 10D:
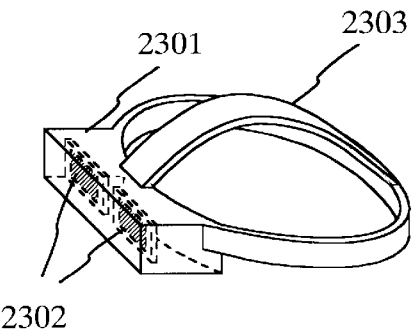

FIG. 10D shows a head mount display that is constituted of a main body 2301, a display device 2302, and a band portion 2303. The present invention can be applied to the display device 2302.

Figure 10E:
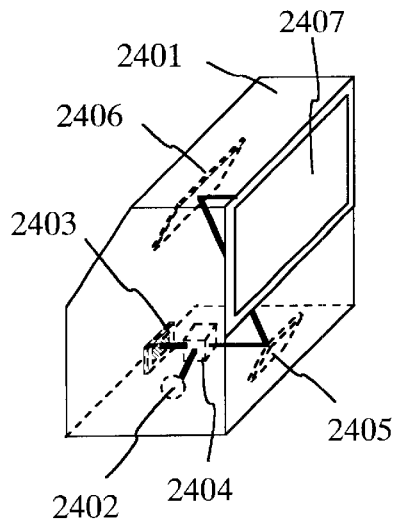

FIG. 10E shows a rear type projector that is constituted of a main body 2401, a light source 2402, a display device 2403, a polarizing beam splitter 2404, reflectors 2405 and 2406, and a screen 2407. The present invention can be applied to the display device 2403.

Figure 10F:
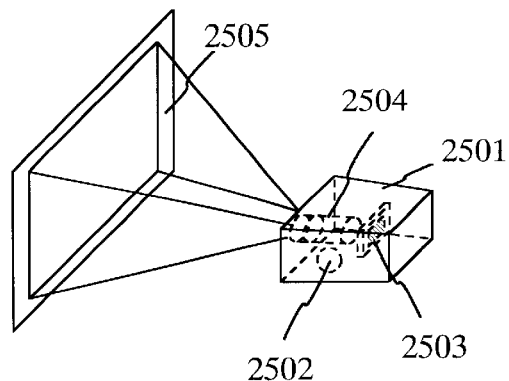

FIG. 10F shows a front type projector that is constituted of a main body 2501, a light source 2502, a display device 2503, an optical system 2504, and a screen 2505. The present invention can be applied to the display device 2503.

As set forth above, the scope of application of the present invention is extremely wide and the present invention can be applied to electronic apparatus of any field. Especially, it can be said that the present invention is very effective for electronic apparatus in which importance is attached to portability.

As described above, by using the present invention, it becomes possible to manufacture a semiconductor thin film with high crystallinity by manufacturing steps having high productivity. Then, it is possible to realize a semiconductor device including a circuit using a high performance TFT with an active layer of such a semiconductor thin film.

What is claimed is:

1. A method of manufacturing a semiconductor device comprising the steps of:
    forming an amorphous semiconductor film on an insulating surface;
    forming a film comprising germanium in contact with said amorphous semiconductor film;
    first heating said amorphous semiconductor film and said film comprising germanium to crystallize said amorphous semiconductor film; and
    second heating said crystallized semiconductor film to fix an interface between said crystallized semiconductor film and said insulating surface.

2. The method according to claim 1 wherein said semiconductor device is selected from the group consisting of a video camera, a still camera, a projector, a projection TV, a head mount display, a car navigation system, a personal computer, a mobile computer and a portable telephone.

3. The method according to claim 1 wherein said semiconductor device is an electroluminescence display device.

4. The method according to claim 1 wherein said first heating step is conducted at a temperature between 450 to 650° C.

5. The method according to claim 1 wherein said film comprising germanium is formed b a method selected from the group consisting of a sputtering method, a plasma CVD method, and a low pressure CVD method.

6. The method according to claim 1 further comprising a step of forming a silicon nitride film or a silicon nitride oxide film on said film comprising germanium before said first heating step.

7. The method according to claim 1 wherein said amorphous semiconductor film comprises an amorphous silicon film.

8. The method according to claim 1 wherein a temperature of said second heating step is higher than said first heating step.

9. The method according to claim 1 further comprising a step of cooling said crystallized semiconductor film between said first and said second heating steps.

10. The method according to claim 1 wherein said step of forming said amorphous semiconductor film, said step of forming said film comprising germanium, and said first heating step are carried out continuously without exposing to the air.

11. A method of manufacturing a semiconductor device comprising the steps of:
    forming an amorphous semiconductor film on an insulating surface;
    forming a film comprising germanium in contact with a selected portion of said amorphous semiconductor film;
    first heating said amorphous semiconductor film and said film comprising germanium to crystallize said amorphous semiconductor film; and
    second heating said crystallized semiconductor film to fix an interface between said crystallized semiconductor film and said insulating surface.

12. The method according to claim 11 wherein said semiconductor device is selected from the group consisting of a video camera, a still camera, a projector, a projection TV, a head mount display, a car navigation system, a personal computer, a mobile computer and a portable telephone.

13. The method according to claim 11 wherein said semiconductor device is an electroluminescence display device.

14. The method according to claim 11 wherein said first heating step is conducted at a temperature between 450 to 650° C.

15. The method according to claim 11 wherein said film comprising germanium is formed by a method selected from the group consisting of a sputtering method, a plasma CVD method, and a low pressure CVD method.

16. The method according to claim 1 further comprising a step of forming a silicon nitride film or a silicon nitride oxide film on said film comprising germanium before said first heating step.

17. The method according to claim 11 wherein said amorphous semiconductor film comprises an amorphous silicon film.

18. The method according to claim 11 wherein a temperature of said second heating step is higher than said first heating step.

19. The method according to claim 11 further comprising a step of cooling said crystallized semiconductor film between said first and said second heating steps.

20. The method according to claim 11 wherein said step of forming said amorphous semiconductor film, said step of forming said film comprising germanium, and said first heating step are carried out continuously without exposing to the air.

21. A method of manufacturing a semiconductor device comprising the steps of:
    forming an amorphous semiconductor film on an insulating surface;
    forming a film comprising germanium in contact with said amorphous semiconductor film;
    irradiating said amorphous semiconductor film and said film comprising germanium with a light from a lamp to crystallize said amorphous semiconductor film; and
    heating said crystallized semiconductor film to fix an interface between said crystallized semiconductor film and said insulating surface.

22. The method according to claim 21 wherein said semiconductor device is selected from the group consisting of a video camera, a still camera, a projector, a projection TV, a head mount display, a car navigation system, a personal computer, a mobile computer and a portable telephone.

23. The method according to claim 21 wherein said semiconductor device is an electroluminescence display device.

24. The method according to claim 21 wherein said light comprises an infrared light.

25. The method according to claim 21 wherein said film comprising germanium is formed by a method selected from the group consisting of a sputtering method, a plasma CVD method, and a low pressure CVD method.

26. The method according to claim 21 further comprising a step of forming a silicon nitride film or a silicon nitride oxide film on said film comprising germanium before said irradiating step.

27. The method according to claim 21 wherein said amorphous semiconductor film comprises an amorphous silicon film.

28. The method according to claim 21 wherein a temperature of said heating step is higher than said irradiating step.

29. The method according to claim 21 further comprising a step of cooling said crystallized semiconductor film between said irradiating step and said heating step.

30. The method according to claim 21 wherein said step of forming said amorphous semiconductor film, said step of forming said film comprising germanium, and said irradiating step are carried out continuously without exposing to the air.

31. A method of manufacturing a semiconductor device comprising the steps of:
    forming an amorphous semiconductor film on an insulating surface;
    forming a film comprising germanium in contact with a selected portion of said amorphous semiconductor film;
    irradiating said amorphous semiconductor film and said film comprising germanium with a light from a lamp to crystallize said amorphous semiconductor film; and
    heating said crystallized semiconductor film to fix an interface between said crystallized semiconductor film and said insulating surface.

32. The method according to claim 31 wherein said semiconductor device is selected from the group consisting of a video camera, a still camera, a projector, a projection TV, a head mount display, a car navigation system, a personal computer, a mobile computer and a portable telephone.

33. The method according to claim 31 wherein said semiconductor device is an electroluminescence display device.

34. The method according to claim 31 wherein said light comprises an infrared light.

35. The method according to claim 31 wherein said film comprising germanium is formed by a method selected from the group consisting of a sputtering method, a plasma CVD method, and a low pressure CVD method.

36. The method according to claim 31 further comprising a step of forming a silicon nitride film or a silicon nitride oxide film on said film comprising germanium before said irradiating step.

37. The method according to claim 31 wherein said amorphous semiconductor film comprises an amorphous silicon film.

38. The method according to claim 31 wherein a temperature of said heating step is higher than said irradiating step.

39. The method according to claim 31 further comprising a step of cooling said crystallized semiconductor film between said irradiating step and said heating step.

40. The method according to claim 31 wherein said step of forming said amorphous semiconductor film, said step of forming said film comprising germanium, and said irradiating step are carried out continuously without exposing to the air.

41. A method of manufacturing a semiconductor device comprising the steps of:
    forming an amorphous semiconductor film on an insulating surface;
    forming a film comprising germanium in contact with said amorphous semiconductor film;
    performing a rapid thermal annealing to crystallize said amorphous semiconductor film; and
    heating said crystallized semiconductor film to fix an interface between said crystallized semiconductor film and said insulating surface.

42. The method according to claim 41 wherein said semiconductor device is selected from the group consisting of a video camera, a still camera, a projector, a projection TV, a head mount display, a car navigation system, a personal computer, a mobile computer and a portable telephone.

43. The method according to claim 41 wherein said semiconductor device is an electroluminescence display device.

44. The method according to claim 41 wherein said film comprising germanium is formed by a method selected from the group consisting of a sputtering method, a plasma CVD method, and a low pressure CVD method.

45. The method according to claim 41 further comprising a step of forming a silicon nitride film or a silicon nitride oxide film on said film comprising germanium before said rapid thermal annealing step.

46. The method according to claim 41 wherein said amorphous semiconductor film comprises an amorphous silicon film.

47. The method according to claim 41 wherein a temperature of said heating step is higher than said rapid thermal annealing step.

48. The method according to claim 11 further comprising a step of cooling said crystallized semiconductor film between said rapid thermal annealing step and said second heating step.

49. The method according to claim 41 wherein said step of forming said amorphous semiconductor film, said step of forming said film comprising germanium, and said rapid thermal annealing step are carried out continuously without exposing to the air.

50. A method of manufacturing a semiconductor device comprising the steps of:

forming a gate electrode on a substrate;

forming a gate insulating film on at least said gate electrode;

forming an amorphous semiconductor film on said gate insulating film;

forming a film comprising germanium in contact with said amorphous semiconductor film;

first heating said amorphous semiconductor film and said film comprising germanium to crystallize said amorphous semiconductor film; and second heating said crystallized semiconductor film to fix an interface between said crystallized semiconductor film and said gate insulating film.

51. The method according to claim 50 wherein said amorphous semiconductor film comprises an amorphous silicon film.

52. The method according to claim 50 wherein a temperature of said second heating step is higher than said first heating step.

53. The method according to claim 50 further comprising a step of cooling said crystallized semiconductor film between said first and said second heating steps.

54. The method according to claim 50 wherein said semiconductor device is selected from the group consisting of a video camera, a still camera, a projector, a projection TV, a head mount display, a car navigation system, a personal computer, a mobile computer and a portable telephone.

55. The method according to claim 50 wherein said semiconductor device is an electroluminescence display device.

56. The method according to claim 50 wherein said first heating step is conducted at a temperature between 450 to 650° C.

57. The method according to claim 50 wherein said film comprising germanium is formed by a method selected from the group consisting of a sputtering method, a plasma CVD method, and a low pressure CVD method.

58. The method according to claim 50 further comprising a step of forming a silicon nitride film or a silicon nitride oxide film on said film comprising germanium before said first heating step.

59. A method of manufacturing a semiconductor device comprising the steps of:

forming a gate electrode on a substrate;

forming a gate insulating film on at least said gate electrode;

forming an amorphous semiconductor film on said gate insulating film;

forming a film comprising germanium in contact with said amorphous semiconductor film;

irradiating said amorphous semiconductor film and said film comprising germanium with a light from a lamp to crystallize said amorphous semiconductor film; and heating said crystallized semiconductor film to fix an interface between said crystallized semiconductor film and said gate insulating film.

60. The method according to claim 59 wherein said amorphous semiconductor film comprises an amorphous silicon film.

61. The method according to claim 59 wherein a temperature of said heating step is higher than said irradiating step.

62. The method according to claim 59 further comprising a step of cooling said crystallized semiconductor film between said irradiating step and said heating step.

63. The method according to claim 59 wherein said semiconductor device is selected from the group consisting of a video camera, a still camera, a projector, a projection TV, a head mount display, a car navigation system, a personal computer, a mobile computer and a portable telephone.

64. The method according to claim 59 wherein said semiconductor device is an electroluminescence display device.

65. The method according to claim 59 wherein said light comprises an infrared light.

66. The method according to claim 59 wherein said film comprising germanium is formed by a method selected from the group consisting of a sputtering method, a plasma CVD method, and a low pressure CVD method.

67. The method according to claim 59 further comprising a step of forming a silicon nitride film or a silicon nitride oxide film on said film comprising germanium before said irradiating step.

* * * * *